United States Patent
Kariya et al.

(10) Patent No.: US 10,283,422 B2
(45) Date of Patent: May 7, 2019

(54) ION IMPLANTATION METHOD AND ION IMPLANTATION APPARATUS

(71) Applicant: SUMITOMO HEAVY INDUSTRIES ION TECHNOLOGY CO., LTD., Tokyo (JP)

(72) Inventors: Hiroyuki Kariya, Ehime (JP); Hideki Morikawa, Ehime (JP); Masaki Ishikawa, Ehime (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 0 days.

(21) Appl. No.: 15/816,838

(22) Filed: Nov. 17, 2017

(65) Prior Publication Data
US 2018/0145000 A1 May 24, 2018

(30) Foreign Application Priority Data
Nov. 21, 2016 (JP) .................. 2016-225935

(51) Int. Cl.
*H01L 21/00* (2006.01)
*H01L 21/66* (2006.01)
(Continued)

(52) U.S. Cl.
CPC .............. *H01L 22/26* (2013.01); *H01J 37/08* (2013.01); *H01J 37/1474* (2013.01);
(Continued)

(58) Field of Classification Search
CPC ........ H01L 21/265; H01L 22/26; H01L 22/76
(Continued)

(56) References Cited

U.S. PATENT DOCUMENTS

| 4,667,111 | A | 5/1987 | Glavish et al. |
| 5,451,847 | A | 9/1995 | Nakanishi |
| 6,242,747 | B1 | 6/2001 | Sugitani et al. |
| 9,343,263 | B2 | 5/2016 | Sasaki et al. |
| 9,466,467 | B2 | 10/2016 | Kabasawa et al. |

(Continued)

FOREIGN PATENT DOCUMENTS

| JP | S61-264650 A | 11/1986 |
| JP | H07-057898 A | 3/1995 |

(Continued)

*Primary Examiner* — David S Blum
(74) *Attorney, Agent, or Firm* — Michael Best & Friedrich LLP

(57) ABSTRACT

An ion implantation method includes measuring a beam energy of an ion beam that is generated by a high-energy multistage linear acceleration unit operating in accordance with a tentative high-frequency parameter, adjusting a value of the high-frequency parameter based on the measured beam energy, and performing ion implantation by using the ion beam generated by the high-energy multistage linear acceleration unit operating in accordance with the adjusted high-frequency parameter. The tentative high-frequency parameter provides a value different from a value of the high-frequency parameter for achieving a maximum acceleration in design to a high-frequency resonator in a part of stages including at least a most downstream stage. The adjusting includes changing at least one of a voltage amplitude and a phase set for the high-frequency resonator in the part including the at least most downstream stage.

18 Claims, 15 Drawing Sheets

(51) Int. Cl.
*H01J 37/08* (2006.01)
*H01J 37/147* (2006.01)
*H01J 37/244* (2006.01)
*H01J 37/317* (2006.01)
*H01L 21/265* (2006.01)

(52) U.S. Cl.
CPC ........ *H01J 37/244* (2013.01); *H01J 37/3171* (2013.01); *H01L 21/265* (2013.01); *H01J 2237/152* (2013.01); *H01J 2237/2448* (2013.01); *H01J 2237/24585* (2013.01); *H01J 2237/31701* (2013.01)

(58) Field of Classification Search
USPC .......................................................... 438/5
See application file for complete search history.

(56) References Cited

U.S. PATENT DOCUMENTS

2016/0079032 A1* 3/2016 Watanabe ............ H01J 37/304
250/492.3

FOREIGN PATENT DOCUMENTS

| JP | H07-211500 A | 8/1995 |
| JP | H08-023067 B2 | 3/1996 |
| JP | 2569812 B2 | 1/1997 |
| JP | 3365226 B2 | 1/2003 |
| JP | 3448731 B2 | 9/2003 |
| JP | 2015-176750 A | 10/2015 |
| JP | 5963662 B2 | 8/2016 |

* cited by examiner

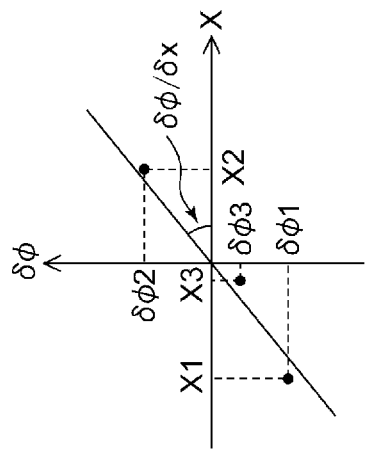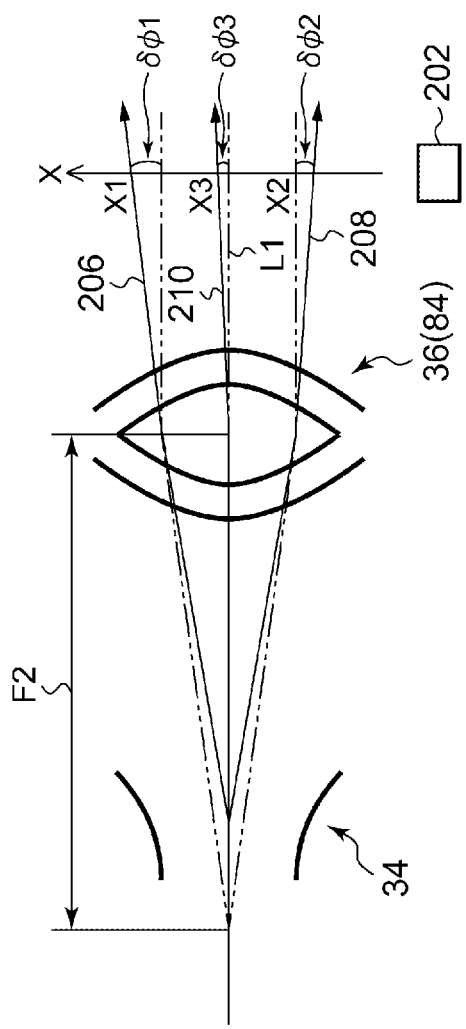

FIG. 13
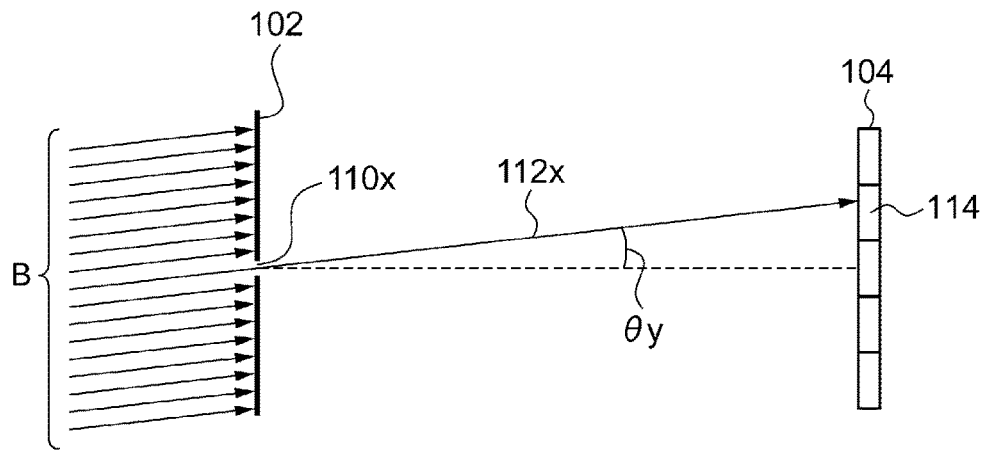
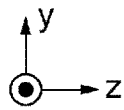
FIG. 14
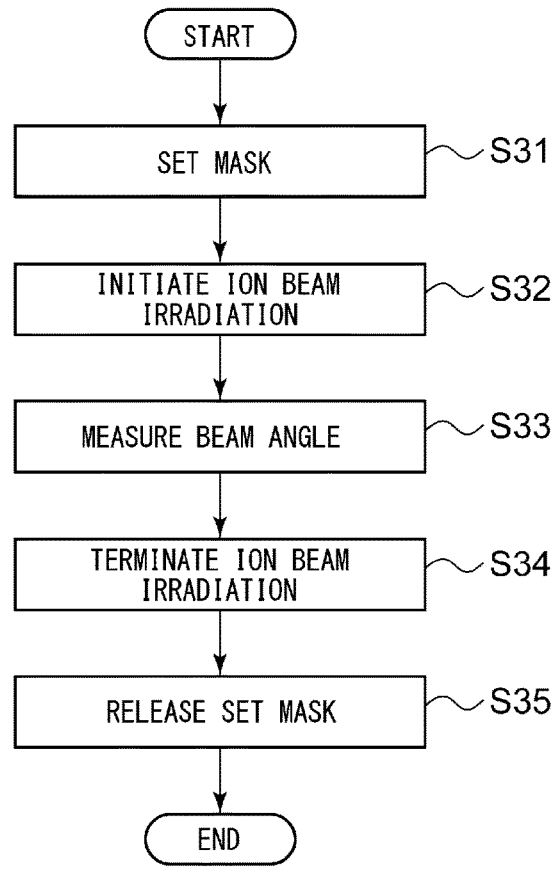

ION IMPLANTATION METHOD AND ION IMPLANTATION APPARATUS

RELATED APPLICATIONS

Priority is claimed to Japanese Patent Application No. 2016-225935, filed Nov. 21, 2016, the entire content of which is incorporated herein by reference.

BACKGROUND

Technical Field

A certain embodiment of the present invention relates to an ion implantation method and an ion implantation apparatus.

Description of Related Art

An ion implantation apparatus that can generate an ion beam having high energy (for example, greater than or equal to 1 MeV) accelerates the ion beam by using a multistage high-frequency linear accelerator (LINAC). The high-frequency linear accelerator optimizes high-frequency parameters such as a voltage amplitude, a frequency, and a phase in each stage to acquire desired energy. The energy distribution of the ion beam accelerated in the linear accelerator spreads due to a high-frequency electric field. Thus, energy is analyzed by using a analyzing electromagnet disposed on the downstream side of the linear accelerator in order to pass only ions having desired energy.

SUMMARY

According to an embodiment of the present invention, there is provided an ion implantation method using an ion implantation apparatus that includes a high-energy multistage linear acceleration unit. The high-energy multistage linear acceleration unit includes a plurality of stages of high-frequency resonators and is configured to operate in accordance with a high-frequency parameter determining voltage amplitudes, frequencies, and phases of the high-frequency resonators in each stage. The ion implantation method includes measuring a beam energy of an ion beam that is generated by the high-energy multistage linear acceleration unit operating in accordance with a tentative high-frequency parameter, adjusting a value of the high-frequency parameter based on the measured beam energy in order to acquire a target beam energy, and performing ion implantation by using the ion beam generated by the high-energy multistage linear acceleration unit operating in accordance with the adjusted high-frequency parameter. The tentative high-frequency parameter is determined in such a manner that a value different from the value of the high-frequency parameter for achieving a maximum acceleration in design is provided to the high-frequency resonator in a part of the plurality of stages of the high-frequency resonators including at least a most downstream stage. The adjusting includes changing at least one of the voltage amplitude and the phase set for the high-frequency resonator in the part including the at least most downstream stage.

According to another embodiment of the present invention, there is provided an ion implantation apparatus. The apparatus includes a high-energy multistage linear acceleration unit having a plurality of stages of high-frequency resonators, and a control device that controls a high-frequency parameter determining voltage amplitudes, frequencies, and phases of the high-frequency resonators in each stage of the high-energy multistage linear acceleration unit. The control device is configured to measure a beam energy of an ion beam that is generated by the high-energy multistage linear acceleration unit operating in accordance with a tentative high-frequency parameter, and to adjust, based on the measured beam energy, a value of the high-frequency parameter in order to acquire a target beam energy. The tentative high-frequency parameter is determined in such a manner that a value different from the value of the high-frequency parameter for achieving a maximum acceleration in design is provided to the high-frequency resonator in a part of the plurality of stages of the high-frequency resonators including at least a most downstream stage. The control device adjusts the value of the high-frequency parameter in order to acquire the target beam energy, by changing at least one of the voltage amplitude and the phase set for the high-frequency resonator in the part including the at least most downstream stage.

Any combination of the above components or substitution of the components or representations of the present invention with each other among a method, an apparatus, a system, and the like is also effective as an embodiment of the present invention.

BRIEF DESCRIPTION OF THE DRAWINGS

FIG. 7A and FIG. 7B are diagrams illustrating measurement of the degree of beam collimation according to an embodiment of the present invention.

FIG. 13 is a diagram of the parallelism measuring unit illustrated in FIG. 10 that is cut in the x-direction position of an x slit of the mask and seen from the x direction.

FIG. 14 is a flowchart illustrating one example of a parallelism measurement process using the parallelism measuring unit illustrated in FIG. 9.

DETAILED DESCRIPTION

In recent years, there has been need for further improvement in the accuracy of energy in an ion implantation process that uses a high-energy beam, and significantly high accuracy has been required in order to adjust the energy to a desired energy value. Narrowing an energy analysis slit can improve the accuracy of energy of the beam but causes a decrease in the acquired intensity of a beam current and thus, is not a realistic measure. Both the intensity of the beam current and the accuracy of energy of the beam are considered achievable if the high-frequency parameters of the linear accelerator can be set with high accuracy. However, for example, in the case of a significant difference between a target value and a measured value of beam energy, optimization of the parameters based on measurement is required to be executed multiple times, and adjustment of the energy requires a large amount of time.

It is desirable to provide a technology that promptly and accurately adjusts the energy of an ion beam generated by a linear accelerator.

Hereinafter, an embodiment of the present invention will be described in detail with reference to the drawings. The same elements in description of the drawings will be designated by the same reference signs and may not be described repeatedly. The following configurations are for illustrative purposes, and the scope of the present invention is not limited by the configurations.

Figure 1:
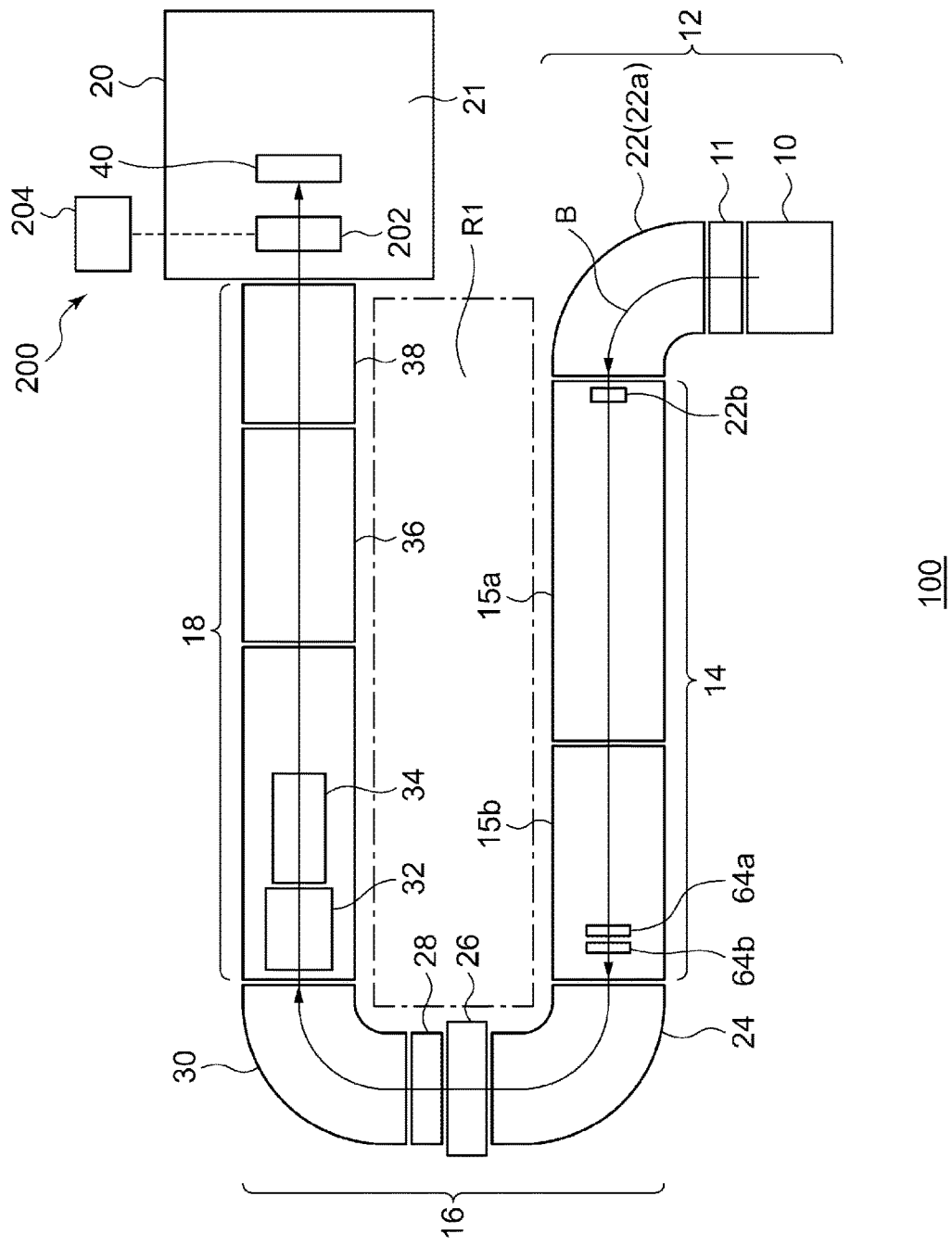
FIG. 1 is a top view schematically illustrating an ion implantation apparatus according to an embodiment of the present invention.

FIG. 1 is a top view schematically illustrating an ion implantation apparatus 100 according to an embodiment of the present invention. The ion implantation apparatus 100 is a so-called high-energy ion implantation apparatus. The high-energy ion implantation apparatus is an ion implantation apparatus having a high-frequency linear acceleration ion accelerator and a high-energy ion transfer beamline. The high-energy ion implantation apparatus accelerates ions generated in an ion source 10 and transfers an acquired ion beam B to a processed object (for example, a substrate or a wafer 40) along the beamline, thereby implanting ions into the processed object.

FIG. 1 illustrates a layout of components of a beamline unit of the ion implantation apparatus 100. The beamline unit of the ion implantation apparatus 100 includes the ion source 10 and a processing chamber 21 for performing an ion implantation process for the processed object. The beamline unit is configured to transfer the ion beam B toward the processed object from the ion source 10.

As illustrated in FIG. 1, the high-energy ion implantation apparatus 100 includes an ion beam generating unit 12 that generates ions and analyzes the ions based on the mass of the ions, a high-energy multistage linear acceleration unit 14 that accelerates the ion beam to acquire a high-energy ion beam, a beam deflecting unit 16 that analyzes the energy of the high-energy ion beam, corrects a reference trajectory, and controls dispersion of energy, a beam transfer line unit 18 that transfers the analyzed high-energy ion beam to the wafer 40, and a substrate processing unit 20 that uniformly implants the transferred high-energy ion beam into a semiconductor wafer.

The ion beam generating unit 12 has the ion source 10, an extraction electrode 11, and a mass analyzing device 22. In the ion beam generating unit 12, a beam is extracted through the extraction electrode 11 from the ion source 10 and is accelerated at the same time, and the mass analyzing device 22 analyzes the mass of the extracted and accelerated beam. The mass analyzing device 22 has a mass analysis magnet 22a and a mass analysis slit 22b. While the mass analysis slit 22b may be disposed immediately after the mass analysis magnet 22a, the mass analysis slit 22b in the embodiment is disposed in an entrance portion of the high-energy multistage linear acceleration unit 14 which is the configuration subsequent to the mass analysis magnet 22a. As a result of mass analysis by the mass analyzing device 22, an ion type required for implantation is selected, and the ion beam of the selected ion type is guided to the subsequent high-energy multistage linear acceleration unit 14.

Figure 2:
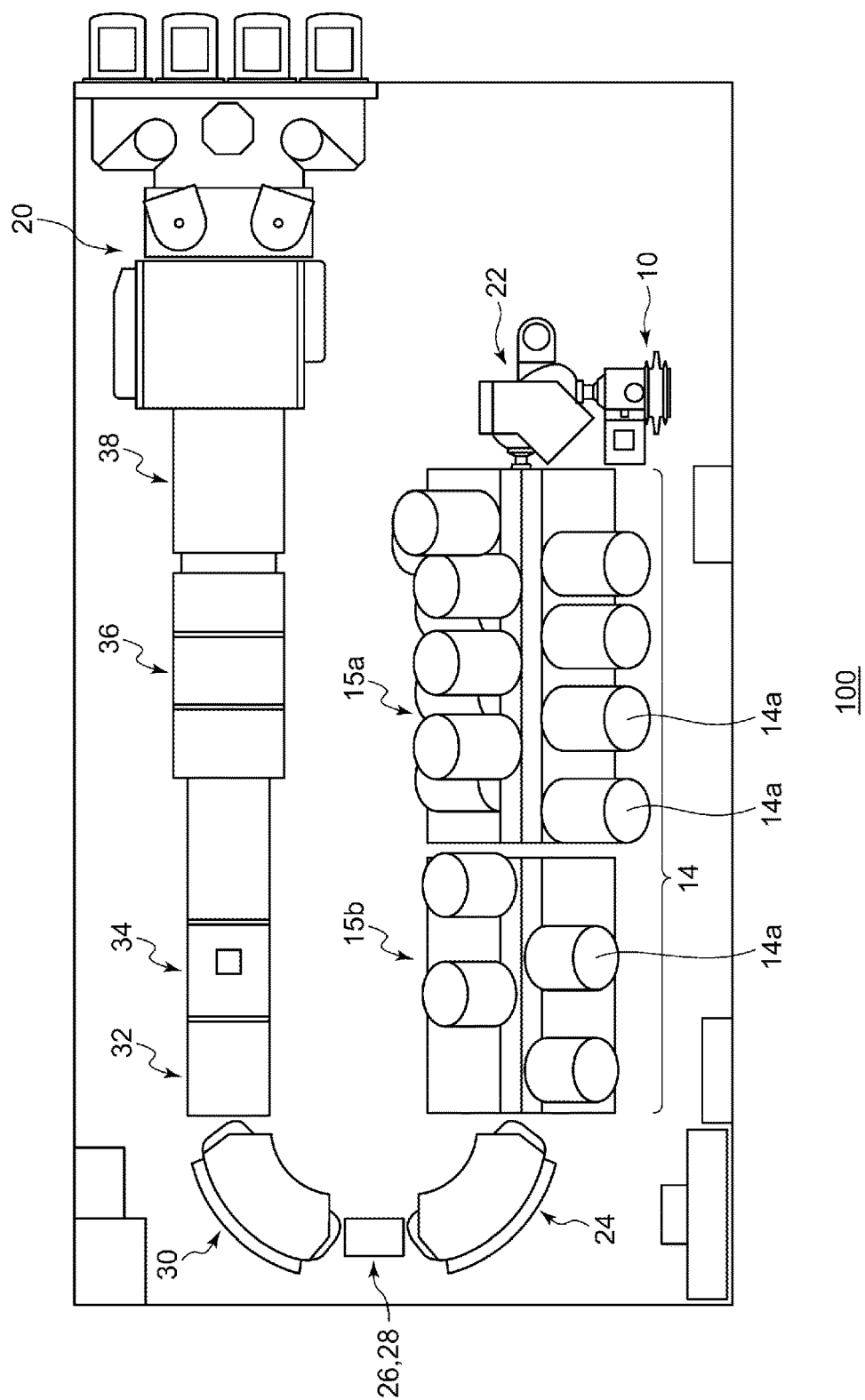
FIG. 2 is a plan view illustrating an overall layout including a schematic configuration of a high-energy multistage linear acceleration unit illustrated in FIG. 1.

FIG. 2 is a plan view illustrating an overall layout including a schematic configuration of the high-energy multistage linear acceleration unit 14. The high-energy multistage linear acceleration unit 14 includes acceleration gaps between which a plurality of linear acceleration devices accelerating the ion beam, that is, one or more high-frequency resonators 14a, is interposed. The high-energy multistage linear acceleration unit 14 can accelerate ions by a high-frequency (RF) electric field.

The high-energy multistage linear acceleration unit 14 includes a first linear accelerator 15a that includes a plurality of basic stages of the high-frequency resonators 14a for high-energy ion implantation. The high-energy multistage linear acceleration unit 14 may include a second linear accelerator 15b that includes a plurality of additional stages of the high-frequency resonators 14a for ultra-high-energy ion implantation. The direction of the ion beam further accelerated by the high-energy multistage linear acceleration unit 14 is changed by the beam deflecting unit 16.

A voltage amplitude V[kV] and a frequency f[Hz] have to be considered as high-frequency parameters in an ion implantation apparatus using high-frequency (RF) acceleration. Furthermore, in the case of performing high-frequency acceleration in a plurality of stages, a phase φ[deg] of each high frequency is added as a parameter. A magnetic field lens (for example, a quadrupole electromagnet) or an electric field lens (for example, an electric field quadrupole electrode) is required in order to control upward, downward, leftward, and rightward spreading of the ion beam by using a converging and diverging effect during acceleration or after acceleration. Operating parameters of the magnetic field lens or the electric field lens have optimal values that change depending on the energy of ions at the time of passing the magnetic field lens or the electric field lens. In addition, the intensity of the acceleration electric field affects convergence and divergence. Thus, the values of the operating parameters are determined after the high-frequency parameters are determined.

Figure 3:
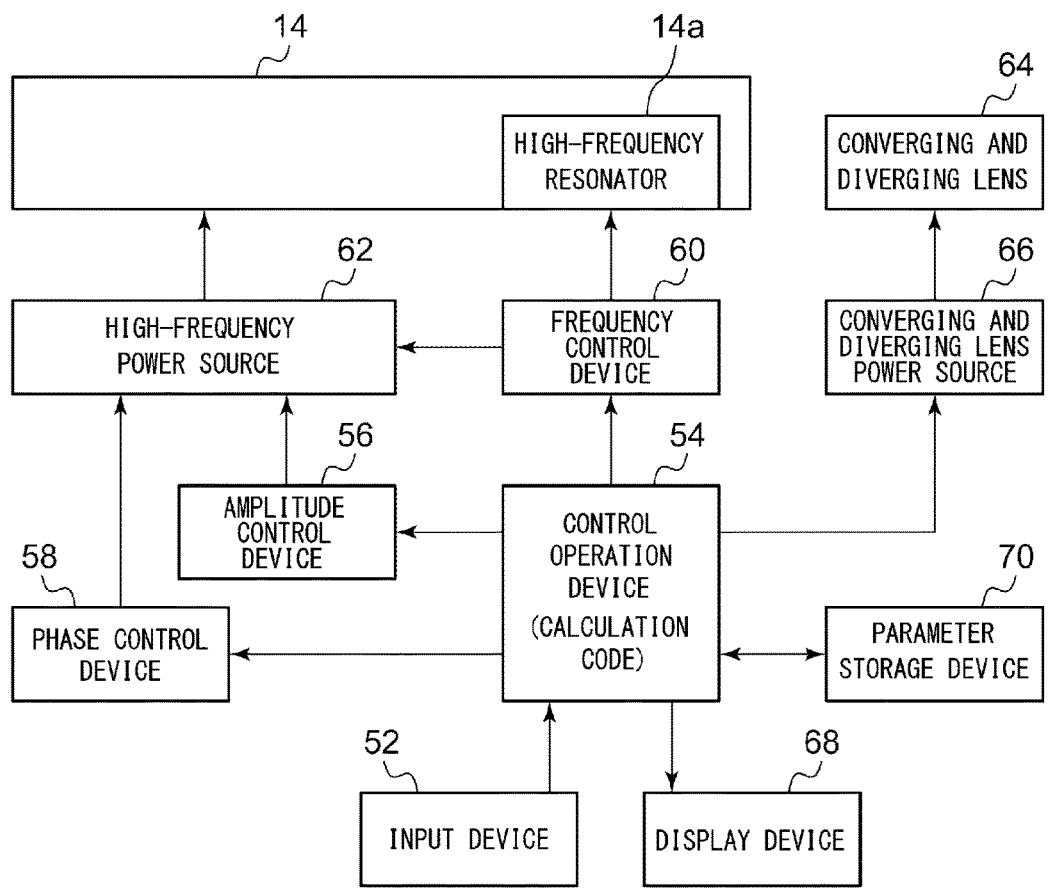
FIG. 3 is a block diagram illustrating functions and configurations of a control unit of the high-energy multistage linear acceleration unit illustrated in FIG. 1.

FIG. 3 is a block diagram illustrating a configuration of a control unit 120 for a converging and diverging lens and a high-energy multistage linear acceleration unit 14 in which acceleration electric fields (gaps) at the tip ends of a plurality of high-frequency resonators are linearly arranged.

The high-energy multistage linear acceleration unit includes one or more high-frequency resonators 14a. Components required for control of the high-energy multistage linear acceleration unit 14 include an input device 52 that allows an operator to input a necessary condition, a control operation device 54 that calculates the numerical values of various parameters from the input condition and controls each component, an amplitude control device 56 that adjusts the voltage amplitude of the high frequency, a phase control device 58 that adjusts the phase of the high frequency, a frequency control device 60 that controls the frequency of the high frequency, a high-frequency power source 62, a converging and diverging lens power source 66 for a converging and diverging lens 64, a display device 68 that displays the operating parameters, and a storage device 70 that stores the determined parameters. The control operation device 54 incorporates in advance a numerical value calculation code (program) that calculates the numerical values of various parameters.

In the control operation device 54 of the high-frequency linear accelerator, the incorporated numerical value calculation code simulates acceleration, convergence, and divergence of the ion beam based on the input condition and calculates the high-frequency parameters (the voltage amplitude, the frequency, and the phase) in order to achieve an optimal transfer efficiency. At the same time, parameters (a Q coil current or a Q electrode voltage) of the converging and diverging lens 64 are calculated in order to efficiently transfer the ion beam. Various parameters calculated are displayed on the display device 68. For an acceleration condition that exceeds the capability of the high-energy multistage linear acceleration unit 14, an indication meaning that a solution does not exist is displayed on the display device 68.

The voltage amplitude parameter is sent to the amplitude control device 56 from the control operation device 54, and the amplitude control device 56 adjusts the amplitude of the high-frequency power source 62. The phase parameter is sent to the phase control device 58 from the control operation device 54, and the phase control device 58 adjusts the phase of the high-frequency power source 62. The frequency parameter is sent to the frequency control device 60 from the control operation device 54. The frequency control device 60 controls the generated frequency of the high-frequency power source 62 and controls the resonant frequencies of the high-frequency resonators 14a of the high-energy multistage linear acceleration unit 14. The control operation device 54 controls the converging and diverging lens power source 66 by using the calculated converging and diverging lens parameters.

A necessary number of the converging and diverging lenses 64 for efficient transfer of the ion beam are disposed inside or at the front and rear of the high-frequency linear accelerator. That is, a diverging lens and a converging lens are alternately included at the front and rear of the acceleration gaps at the tip ends of the plurality of stages of high-frequency resonators 14a. An additional vertical converging lens 64b is disposed at the rear of a horizontal converging lens 64a at the terminal end of a second linear accelerator 15b. The vertical converging lens 64b causes an ion beam having an optimal two-dimensional beam profile to be incident on the beam deflecting unit 16 in the rear stage by adjusting convergence and divergence of the high-energy accelerated ion beam passing the high-energy multistage linear acceleration unit 14.

As illustrated in FIG. 1 and FIG. 2, the beam deflecting unit 16 has an energy analysis electromagnet 24, a horizontal converging quadrupole lens 26 that reduces energy dispersion, an energy analysis slit 28, and a deflecting electromagnet 30 that provides steering (trajectory correction). The energy analysis electromagnet 24 may be referred to as an energy filter electromagnet (EFM). The direction of the high-energy ion beam is changed toward the wafer 40 by the beam deflecting unit 16.

The beam transfer line unit 18 transfers the ion beam B coming from the beam deflecting unit 16 and has a beam shaper 32 configured with a converging/diverging lens group, a beam scanner 34, a beam parallelizer 36, and a final energy filter 38 (includes a final energy analysis slit). The length of the beam transfer line unit 18 is designed in accordance with the lengths of the ion beam generating unit 12 and the high-energy multistage linear acceleration unit 14. The beam transfer line unit 18 is connected to the beam deflecting unit 16, and a U-shaped layout as a whole is formed.

The substrate processing unit 20 is disposed at the downstream side terminal end of the beam transfer line unit 18. The processing chamber 21 accommodates a beam monitor that measures the beam current, the position, the implantation angle, the convergence and divergence angle, the upward, downward, leftward, and rightward ion distribution, and the like of the ion beam B, an anti-charging device that prevents the wafer 40 from being charged by the ion beam B, a wafer transport mechanism that places the wafer 40 in a proper position or angle for putting the wafer 40 in and out, an electro static chuck (ESC) that holds the wafer 40 during ion implantation, and a wafer scan mechanism that moves the wafer 40 in a direction perpendicular to a beam scan direction at a speed corresponding to a change in the beam current during implantation.

The beamline unit of the ion implantation apparatus 100 is configured as a horizontal U-shaped folded beamline having two long linear portions facing each other. The upstream long linear portion is configured with a plurality of units accelerating the ion beam B generated in the ion source 10. The downstream long linear portion is configured with a plurality of units adjusting the ion beam B of which the direction with respect to the upstream long linear portion is changed, and implanting the ion beam B into the wafer 40. The two long linear portions are configured to have approximately the same length. A workspace R1 having a sufficient width for maintenance work is disposed between the two long linear portions.

The high-energy ion implantation apparatus 100 in which each unit is disposed in a U-shape reduces an installation area and provides favorable workability. In addition, configuring each unit or each device of the high-energy ion implantation apparatus 100 as modules enables attaching, detaching, or combining the modules in accordance with a beamline reference position.

The high-energy multistage linear acceleration unit 14 and the beam transfer line unit 18 are disposed in a folded shape. Thus, the total length of the high-energy ion implantation apparatus 100 can be reduced. The high-energy multistage linear acceleration unit 14 and the beam transfer line unit 18 are arranged in an approximately linear shape in an apparatus in the related art. The radiuses of curvature of a plurality of deflecting electromagnets constituting the beam deflecting unit 16 are optimized to minimize the width of the apparatus. Accordingly, the installation area of the apparatus can be minimized, and work can be performed for each of the high-energy multistage linear acceleration unit 14 and the beam transfer line unit 18 in the workspace R1 interposed between the high-energy multistage linear acceleration unit 14 and the beam transfer line unit 18. The ion source 10 having a comparatively short maintenance interval is disposed adjacent to the substrate processing unit 20 where supply/withdrawal of the substrate is required. Thus, a worker moves a small distance.

Figure 4:
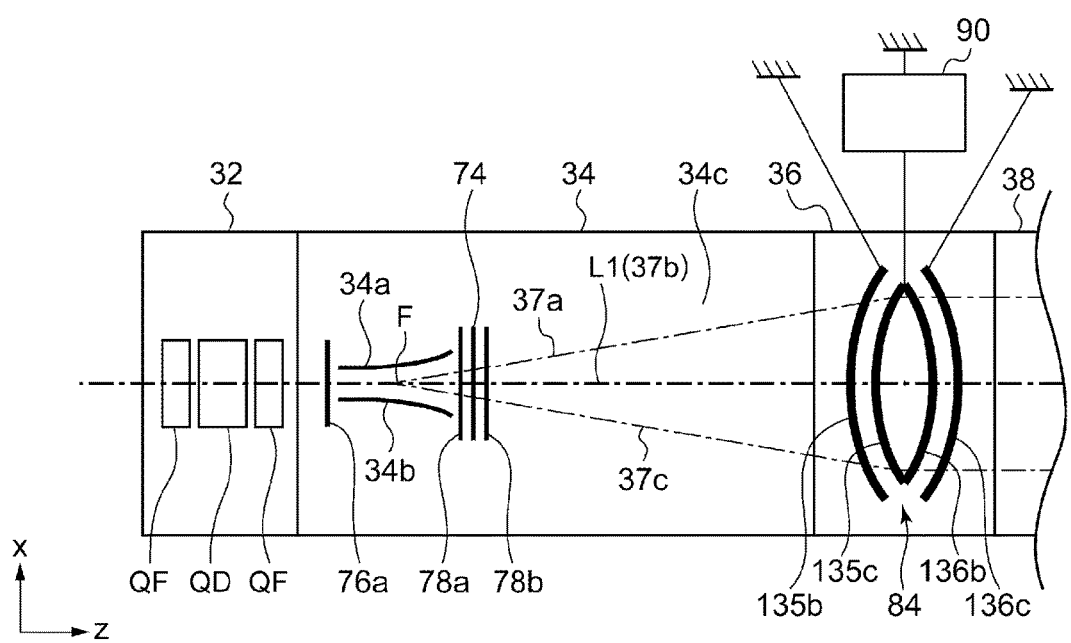
FIG. 4 is a plan view illustrating a schematic configuration of a part of a beam transfer line unit illustrated in FIG. 1.

FIG. 4 is a plan view illustrating a schematic configuration of a part of the beam transfer line unit 18. The beam deflecting unit 16 (refer to FIG. 1) separates only necessary ion type, and a beam having only ions of a necessary energy value is shaped to have a desired sectional shape by the beam shaper 32. As illustrated in FIG. 4, the beam shaper 32 is configured with a (electric field or magnetic field) converging/diverging lens group such as a Q (quadrupole) lens. The beam having a shaped sectional shape is scanned in a direction parallel to the page of FIG. 4 by the beam scanner 34. For example, the beam shaper 32 is configured as a triplet Q lens group including a horizontal converging (vertical diverging) lens QF, a horizontal diverging (vertical converging) lens QD, and the horizontal converging (vertical diverging) lens QF. If necessary, the beam shaper 32 can be configured to have one horizontal converting lens QF and one horizontal diverging lens QD or a combination of a plurality of the horizontal converting lenses QF and a plurality of the horizontal diverging lenses QD.

The beam scanner 34 is a deflecting scan device (referred to as a beam scanner) that uses a periodically changing electric field to reciprocatingly and periodically scan an ion beam in a horizontal direction orthogonal with respect to the traveling direction of the ion beam.

The beam scanner 34 includes one pair (two) of opposite electrodes 34a and 34b (dipole deflecting scan electrode) disposed to face each other in the traveling direction of the beam with the area passed by the ion beam interposed therebetween. A scan voltage similar to a triangular wave that changes between positive and negative at a constant frequency in the range of 0.5 Hz to 4,000 Hz is applied in opposite signs to each of the two opposite electrodes 34a and 34b. In the gap between the two opposite electrodes 34a and 34b, the scan voltage generates an electric field that changes to deflect the beam passing the gap. The periodically changing scan voltage causes the beam passing the gap to be scanned in the horizontal direction.

A suppression electrode 74 that has an opening is disposed on the downstream side of the beam scanner 34 in the area passed by the ion beam between two ground electrodes 78a and 78b. A ground electrode 76a is disposed on the upstream side of the beam scanner 34 at the front of the scan electrode. If necessary, a suppression electrode having the same configuration as the suppression electrode 74 on the downstream side of the beam scanner 34 can be disposed on the upstream side of the beam scanner 34. The suppression electrode suppresses electrons entering a positive electrode.

A beam scan space portion 34c is disposed in a long section on the downstream side of the beam scanner 34 in a scan housing and is configured to achieve a sufficient scan width even in the case of a narrow beam scan angle. The beam parallelizer 36 that adjusts the direction of the deflected ion beam to the direction of the ion beam before beam scan deflection, that is, bends the deflected ion beam to a direction parallel to a beam trajectory L1, is disposed at the rear of the scan housing downstream of the beam scan space portion 34c.

An aberration generated in the beam parallelizer 36 (the difference in focal length between the central portion and the left and right end portions of the beam parallelizer) is proportional to the square of the deflection angle of the beam scanner 34. Thus, decreasing the deflection angle by increasing the length of the beam scan space portion 34c significantly contributes to reduction of the aberration in the beam parallelizer 36. A large aberration causes a difference in beam size and beam divergence angle between the central portion and the left and right end portions of the wafer when the ion beam is implanted into the semiconductor wafer, and thus, leads to variations in product quality.

Adjusting the length of the beam scan space portion 34c enables setting the length of the beam transfer line unit in accordance with the length of the high-energy multistage linear acceleration unit 14.

An electric field collimating lens 84 is disposed in the beam parallelizer 36. As illustrated in FIG. 4, the electric field collimating lens 84 is configured with a pair of a plurality of acceleration electrodes and a pair of a plurality of deceleration electrodes in an approximately hyperbolic shape. The electrode pairs face each other through acceleration and deceleration gaps having a width that does not cause discharge. An electric field that has an axial-direction component and a horizontal component is formed in each of the acceleration and deceleration gaps. The axial-direction component causes acceleration and deceleration of the ion beam. The horizontal component has an intensity increasing in proportion to the distance from a reference axis and causes the ion beam to converge in the horizontal direction.

The downstream side electrode of the electrode pair with the acceleration gap interposed therebetween forms a single structure with the electrode on the upstream side of the deceleration gap to have the same electric potential. The electrode on the downstream side of the deceleration gap forms a single structure with the electrode on the upstream side of the subsequent acceleration gap to have the same electric potential.

The first electrode (incidence electrode) and the last electrode (emission electrode) from the upstream side of the electric field collimating lens 84 have ground electric potential. Accordingly, the energy of the beam does not change before and after passing the collimating lens 84.

In the middle electrode structure, the electrode on the exit side of the acceleration gap and the electrode on the entrance side of the deceleration gap are connected to a variable constant voltage negative power source 90. The electrode on the exit side of the deceleration gap and the electrode on the entrance side of the acceleration gap are connected to a variable constant voltage positive power source (when n stages exist, the order is negative, positive, negative, positive, negative, . . . ). Accordingly, the ion beam is repeatedly accelerated and decelerated toward a direction parallel to the reference beam trajectory in a stepwise manner. The ion beam is finally set on a trajectory that is parallel to the traveling direction of the ion beam before a deflecting scan (the direction of the beam trajectory).

As illustrated in FIG. 4, the beam parallelizer 36 has a focal point F on the reference beam trajectory in design (for example, the beam trajectory L1 illustrated in FIG. 4). Each of a plurality of beam trajectories 37a, 37b, and 37c incident on the beam parallelizer 36 has a different angle with the reference beam trajectory. The beam parallelizer 36 is designed to deflect each of the plurality of beam trajectories 37a, 37b, and 37c at different deflection angles in accordance with the incidence angles thereof, thereby making the plurality of beam trajectories 37a, 37b, and 37c parallel to the reference beam trajectory. The beam parallelizer 36 operates by receiving an electrical input (for example, a voltage) that is determined in advance in accordance with a given ion implantation condition (includes, for example, target beam energy).

The plurality of beam trajectories 37a, 37b, and 37c is on one plane including the reference beam trajectory and is directed to have different incidence angles on the beam parallelizer 36 from the focal point F in the plane. In the present embodiment, the plurality of beam trajectories 37a, 37b, and 37c is the result of a scan performed by the beam scanner 34. Thus, the plane corresponds to a scan plane (xz plane) of the beam scanner 34. Any of the beam trajectories (the beam trajectory 37b in FIG. 4) may match the reference beam trajectory. In the present embodiment, the reference beam trajectory passes the beam parallelizer 36 without being deflected in the beam parallelizer 36.

The ion implantation apparatus 100 according to the present embodiment is configured to have the focal point F of the beam parallelizer 36 that matches a scan origin of the beam scanner 34. Thus, a beam that is scanned by the beam scanner 34 at the scan origin is caused to converge by the beam parallelizer 36 including the electric field collimating lens or the like and is caused to be parallel to an axis of a deflection angle of zero degrees (reference axis) that is parallel to the traveling direction of the ion beam before the scan (the direction of the beam trajectory). In this case, the area of the scan is left-right symmetric about the reference axis.

The beam parallelizer 36 is configured to collimate the ion beam incident from the beam scanner 34 and forms an area passed by the beam downstream of the beam parallelizer 36. The area passed by the beam spreads in an x direction (horizontal direction) that is perpendicular to a beam transfer direction in a plane perpendicular to the beam transfer direction. The beam parallelizer 36 is, for example, an electrostatic beam parallelizer.

As illustrated in FIG. 1, a beam energy measuring device 200 is disposed in the ion implantation apparatus 100. The beam energy measuring device 200 includes a parallelism measuring unit 202 and an energy calculating unit 204. The parallelism measuring unit 202 is configured to measure, downstream of the beam parallelizer 36, the parallelism of the ion beam (hereinafter, referred to as a "beam parallelism" or "parallelism") passing the beam parallelizer 36. The parallelism measuring unit 202 is disposed in, for example, the processing chamber 21 in which an ion implantation process is performed for the processed object.

As described in detail below, the beam parallelism is an indicator that represents a beam angle error of the ion beam. For example, an indicator that represents an error in beam angle with respect to a direction (x direction) perpendicular to the beam trajectory L1 in the plane defined by the plurality of beam trajectories 37a, 37b, and 37c passing the beam parallelizer 36 may be used as the beam parallelism. The beam parallelism according to the present embodiment represents a relative angular error between local parts of the ion beam rather than represents an overall angular error of the ion beam with respect to the reference beam trajectory in design.

The parallelism measuring unit 202 includes, for example, a divergence mask having a plurality of slits and a profiler cup measuring the beam current. The divergence mask restricts, through the slits, the scanned beam collimated by the beam parallelizer 36. The profiler cup is disposed away from the divergence mask by a predetermined distance L. Generally, a beam current detector such as a profiler cup is disposed in the processing chamber 21 of the previously known ion implantation apparatus 100. By using such a previously known detector, the beam energy measuring device 200 can be configured at low cost.

The parallelism measuring unit 202 measures the beam current as a function of a position in the scan direction (x direction). In an ideal case where the center of the ion beam passing the beam scanner 34 and the beam parallelizer 36 matches the beam trajectory L1, the parallelism measuring unit 202 may calculate the parallelism from, for example, a difference δx between a position having the maximum beam current and a position having the maximum current in design and the predetermined distance L. Details of such a configuration that measures the parallelism will be described below.

The energy calculating unit 204 is configured to calculate the energy of the ion beam from the measured parallelism. The energy calculating unit 204 calculates the amount of difference of the energy of the ion beam from the target beam energy based on the beam parallelism. The energy calculating unit 204 may be a part of the control unit 120 or may be disposed separately from the control unit 120. Alternatively, the energy calculating unit 204 may be a part of a control device configured to control the ion implantation apparatus 100 or may be disposed separately from the control device.

The beam parallelizer 36 collimates the ion beam by deflection or convergence of the ion beam. Thus, deflecting force or converging force required for collimation of the ion beam depends on the energy of the ion beam. That is, as the energy of the ion beam is greater, more deflecting force or converging force is required. The deflecting force or the converging force of the beam parallelizer 36 changes in accordance with the electrical input (for example, a voltage in the case of the electric field collimating lens 84) of the beam parallelizer 36.

Figure 5A:
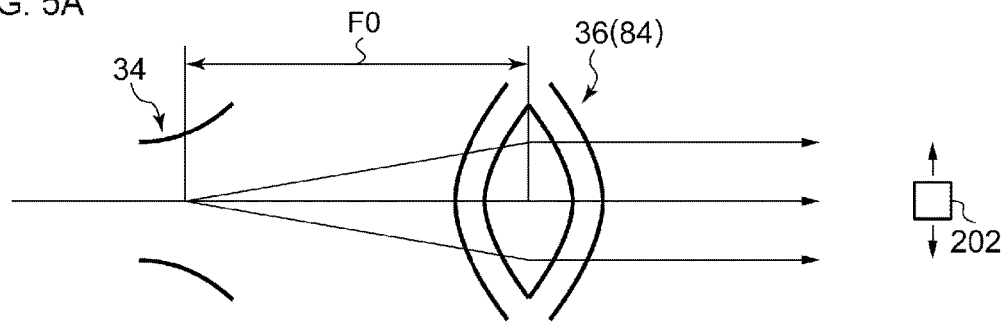
FIG. 5A, FIG. 5B, and FIG. 5C are diagrams illustrating measurement of the degree of beam collimation according to an embodiment of the present invention.

Therefore, a setting of the beam parallelizer 36 that correlates the target beam energy of the ion beam with the electrical input of the beam parallelizer 36 required for collimation of the ion beam is determined in advance in the ion implantation apparatus 100. Under the given ion implantation condition (includes the target beam energy), an electrical input that is determined in accordance with the setting is provided to the beam parallelizer 36 to operate the beam parallelizer 36. Thus, if the energy of the ion beam incident on the beam parallelizer 36 matches the target beam energy, the beam parallelizer 36 can completely collimate the ion beam as illustrated in FIG. 5A. The focal length of the beam parallelizer 36 is denoted by F0 in FIG. 5A.

If the energy of the ion beam is different from the target beam energy, the beam parallelizer 36 cannot completely collimate the ion beam based on the setting corresponding to the target beam energy.

Figure 5B:
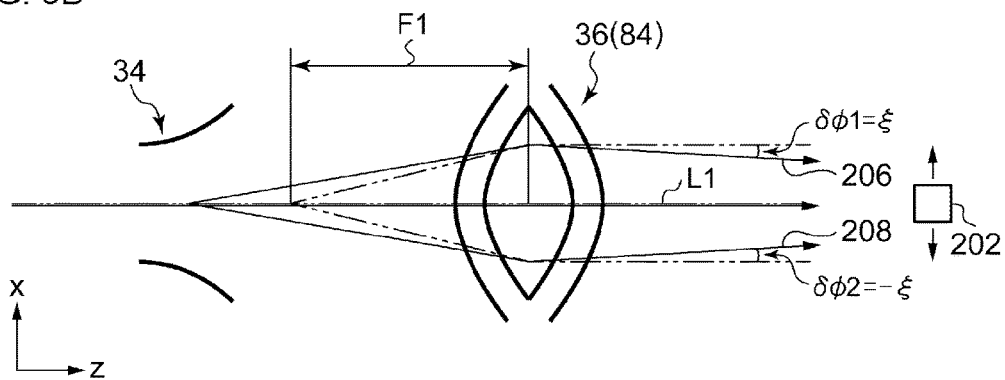
Figure 5C:
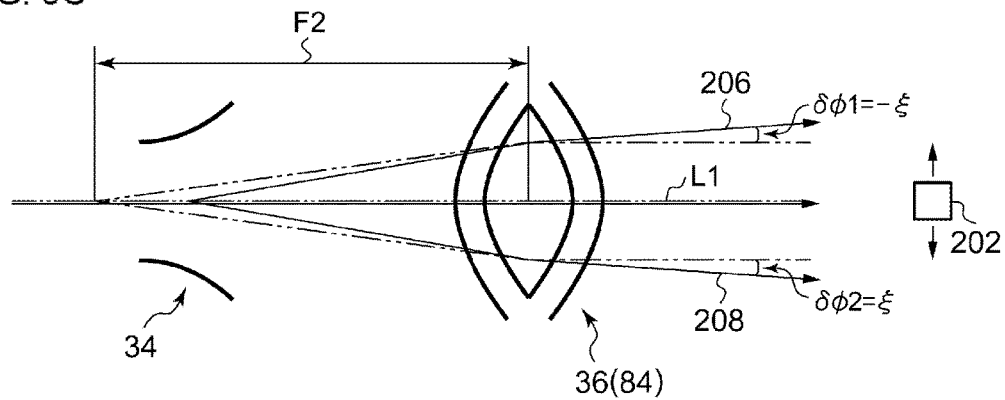

For example, in a case where the energy of the ion beam is smaller than the target beam energy, the ion beam is subjected to excessive convergence or deflection by the beam parallelizer 36, and the beam parallelism deviates from complete collimation. This case is equivalent to the case of decreasing the focal length by setting the focal point F of the beam parallelizer 36 close to the beam parallelizer 36 as illustrated in FIG. 5B (F1<F0). In a case where the energy of the ion beam is greater than the target beam energy, the ion beam is subjected to insufficient convergence or deflection (the beam diverges) by the beam parallelizer 36, and the beam parallelism deviates from complete collimation. This case is equivalent to the case of increasing the focal length by setting the focal point F of the beam parallelizer 36 away from the beam parallelizer 36 as illustrated in FIG. 5C (F2<F0).

The relationship between the difference in energy and the parallelism can be acquired by calculating the electric field and the trajectory of the ion beam around the collimating lens 84. Assume that the focal length is increased by a factor of β when the energy is increased by a factor of α. For a certain value of α, emission angles from the collimating lens 84 that respectively correspond to several scan angles within a scan range of the beam scanner 34 can be calculated. The focal length rate β corresponding to the energy rate α is acquired from the scan angles (that is, incidence angles on the collimating lens 84) and the emission angles from the collimating lens 84. The relationship between the energy rate α and the focal length rate β is acquired by acquiring the focal length rates β respectively corresponding to multiple energy rates α. According to the view of the present inventors, the energy rate α and the focal length rate β have a linear relationship, that is, α=A·β+B (A and B are constants). This relationship does not depend on the scan angle. The focal length rate β corresponds to the difference in parallelism. Thus, the energy rate α can be calculated by measuring the parallelism.

Assume that the actual angle of deflection is φ+δφ when the deflection angle (that is, the difference between the incidence angle and the emission angle) of the ion beam having target beam energy E0 at the time of passing the collimating lens 84 is denoted by φ. If the center of the ion beam matches the beam trajectory L1 as an ideal case, the angular difference δφ can be used as the beam parallelism. The angular difference δφ is proportional to a difference δE in energy. That is, δE=E0×(δφ/φ) is established. In accordance with such a previously known relationship, the energy calculating unit 204 converts the measured beam parallelism (that is, the angular difference δφ) into the amount of difference δE in energy.

The collimating lens 84 is designed with precision in advance in order to realize the deflection angle φ for collimation of the ion beam having the target energy E0. The parallelism is one of main parameters in an implantation process. Thus, the parallelism measuring unit 202 is configured to correctly measure the parallelism (that is, δφ). The target energy E0 is determined as a specification of the performed implantation process. Accordingly, the beam energy measuring device 200 can acquire the accurate amount of difference δE in energy, that is, the energy E0+δE of the ion beam.

A specific example of measurement of the beam parallelism will be described with reference to FIG. 5B and FIG. 5C. The parallelism measuring unit 202 measures the beam angle with respect to a direction (x direction) perpendicular to the reference beam trajectory in a plurality of beam parts of the ion beam. The beam parallelism δφ is defined by using the difference between a beam angle δφ1 of a first beam part 206 and a beam angle δφ2 of a second beam part 208 of the plurality of beam parts. For example, the beam parallelism δφ is defined as δφ=(δφ1−δφ2)/2.

The first beam part 206 is positioned in an edge portion of the ion beam in the x direction. The second beam part 208 is positioned in an edge portion of the ion beam on the opposite side from the first beam part 206 in the x direction. The second beam part 208 and the first beam part 206 are symmetric about the beam trajectory L1. The interval between measurement points is desirably as large as possible in the x direction. The reason is because a larger angular difference is achieved at more separated measurement points in a case where the ion beam converges or diverges in the beam parallelizer 36. Thus, measurement sensitivity is improved.

FIG. 5B and FIG. 5C illustrate a case where the center of the ion beam matches the beam trajectory L1 and where the energy of the ion beam is different from the target beam energy. As illustrated in FIG. 5B, in the case of δφ1=−δφ2=ξ, δφ=(ξ−(−ξ))/2=ξ is established. As illustrated in FIG. 5C, in the case of δφ2=−δφ1=ξ, δφ=(−ξ−ξ)/2=−ξ is established. The acquired beam parallelism δφ can be converted into the difference δE in energy, and the energy of the ion beam can be acquired by using the difference δE in energy.

Figure 6:
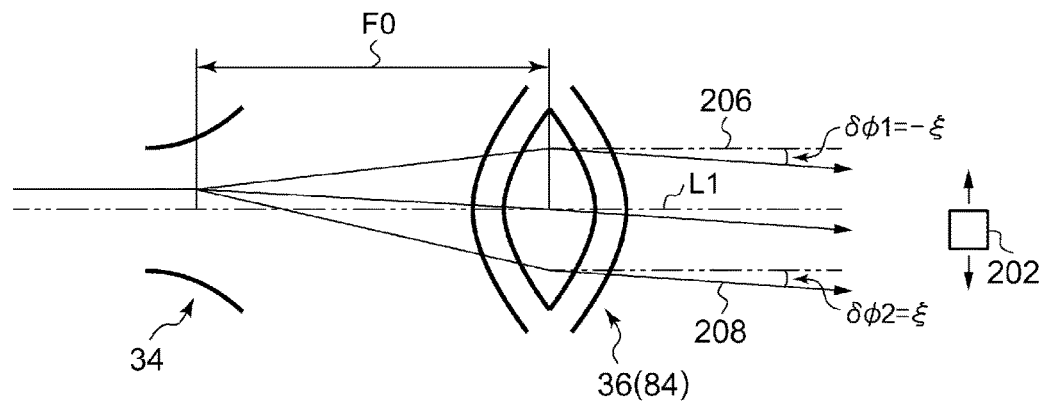
FIG. 6 is a diagram illustrating measurement of the degree of beam collimation according to an embodiment of the present invention.

FIG. 6 illustrates a case where the energy of the ion beam matches the target beam energy and where the center of the ion beam is separated from the beam trajectory L1. As illustrated in FIG. 6, in the case of δφ1=δφ2=ξ, δφ=(ξ−ξ)/2=0 is established. Since the beam parallelism δφ is equal to zero, the difference δE in energy is also equal to zero. That is, there is no difference in energy between the first beam part 206 and the second beam part 208, and the energy of the ion beam matches the target beam energy.

Since the beam parallelism δφ is equal to zero, the first beam part 206 and the second beam part 208 are collimated by the beam parallelizer 36. However, as understood from FIG. 6, since the ion beam is separated from the beam trajectory L1 upstream of the beam parallelizer 36, each of the first beam part 206 and the second beam part 208 is separated from the beam trajectory in design downstream of the beam parallelizer 36 (inclined).

A quantity that is defined by the beam angle at one measurement point can be used as the beam parallelism. However, in this case, if the ion beam is separated from the beam trajectory L1 as illustrated in FIG. 6, the measured beam angle includes error due to a difference in trajectory. Consequently, an incorrect beam parallelism is acquired. Accordingly, the difference in energy acquired from the beam parallelism is also incorrect.

If a quantity defined by the difference in beam angle between two measurement points is used as the beam parallelism as illustrated in FIG. 5B and FIG. 5C, the error due to a difference in trajectory can be excluded. The error due to a difference in trajectory is common in the local parts of the ion beam. In other words, a difference in trajectory upstream of the beam parallelizer 36 causes the same angular difference in any beam part downstream of the beam parallelizer 36. Thus, error included in one measured beam angle and error included in another measured beam angle can be acquired by acquiring a difference in measured beam angle. A correct relative angular difference between beam parts can be found.

The beam angle measurement points may be three or more in number. The parallelism measuring unit 202 may measure the first beam part 206, the second beam part 208, and a third beam part 210. As illustrated in FIG. 7A, the first beam part 206 and the second beam part 208 are on the opposite sides in the x direction as described above, and the third beam part 210 may be near the center of the ion beam. The x-direction measured positions of the first beam part 206, the second beam part 208, and the third beam part 210 measured by the parallelism measuring unit 202 are respectively denoted by X1, X2, and X3.

The parallelism measuring unit 202 generates an x-direction beam angle error distribution with respect to the x-direction position based on three measured beam angles δφ1, δφ2, and δφ3. The error distribution is acquired by any known method (for example, the least squares method). The error distribution is illustrated in FIG. 7B. The beam parallelism can be defined by using the ratio of an amount of change δx in x-direction position and the amount of change δφ in x-direction beam angle corresponding to the amount of change δx in the error distribution. For example, the beam parallelism may be defined as the ratio δφ/δx. That is, the beam parallelism is an angular difference per unit length in the x direction and is the inclination of the error distribution.

If the ion beam has a difference in trajectory, the three measured beam angles δφ1, δφ2, and δφ3 are increased or decreased in accordance with the amount of difference. This case corresponds to translation of the error distribution illustrated in FIG. 7B. That is, the inclination of the error distribution does not change. Thus, error due to a difference in trajectory can be excluded from the beam parallelism by defining the beam parallelism using the ratio δφ/δx.

Such an error distribution may also be generated in the case of two beam angle measurement points. In this case, the ratio δφ/δx may be calculated from the measured value of the x-direction beam angle corresponding to the measured x-direction positions of two beam parts.

As described with reference to FIG. 1, the ion implantation apparatus 100 includes the high-energy multistage linear acceleration unit 14, the energy analysis electromagnet 24, and the energy analysis slit 28. In principle, acceleration performed by the high-energy multistage linear acceleration unit 14 causes the ion beam to have an energy distribution. The ion implantation apparatus 100 is designed to have the center of the energy distribution that matches the center of the slit in a case where the high-energy multistage linear acceleration unit 14 operates with proper parameters. The beam energy after passing the slit is the target beam energy.

In a case where the high-energy multistage linear acceleration unit 14 operates with parameters that are slightly different from the proper parameters, the energy of the ion beam is slightly increased or decreased due to the differences in parameters. Accordingly, the deflection angle of the ion beam deflected by the energy analysis electromagnet 24 is changed, and the center of the energy distribution of the ion beam is separated from the center of the energy analysis slit 28. If the center of the beam is separated from the center of the slit, the beam energy after passing the slit is consequently different from the target beam energy.

The measured energy of the ion beam may be used for controlling the high-energy multistage linear acceleration unit 14. For example, the control unit 120 may control the high-energy multistage linear acceleration unit 14 based on the calculated energy of the ion beam such that the ion beam has the target energy.

In this case, the control unit 120 may control the voltage amplitude V[kV] in at least one high-frequency resonator 14a. Controlling the voltage corresponds to directly adjusting the energy of the ion beam. Preferably, the at least one high-frequency resonator 14a includes the high-frequency resonator in the most downstream stage. By controlling the voltage in the high-frequency resonator in the most downstream stage, the energy of the ion beam can be easily adjusted.

Alternatively, the control unit 120 may control the phase φ[deg] of the high frequency in at least one high-frequency resonator 14a. Adjusting the phase can change the proportion of energy received at the time of acceleration of the beam.

Accordingly, the beam energy can be accurately adjusted. Thus, for example, the depth of implantation into a substrate W can be precisely controlled.

The control unit 120 may determine whether or not the measured amount of difference in energy exceeds a predetermined first threshold. In a case where the amount of difference in energy exceeds the first threshold, the control unit 120 may control the high-energy multistage linear acceleration unit 14 to correct the energy of the ion beam close to the target beam energy. In a case where the amount of difference in energy does not exceed the first threshold, the control unit 120 may determine that the energy of the ion beam is within an allowed range.

The control unit 120 may determine whether or not the measured amount of difference in energy exceeds a predetermined second threshold. In a case where the amount of difference in energy exceeds the second threshold, the control unit 120 may stop the ion implantation process. The second threshold may be greater than the first threshold. The second threshold may be equal to the first threshold. In a case where the measured amount of difference in energy exceeds the predetermined threshold, the control unit 120 may choose whether to stop the ion implantation process or correct the difference in energy.

Instead of comparing the amount of difference in energy with the threshold, the control unit 120 may determine whether or not the energy of the ion beam acquired from the amount of difference in energy is within a predetermined allowed range. Alternatively, instead of the control unit 120, another control device related to the ion implantation apparatus 100 may execute the determination.

Figure 8:
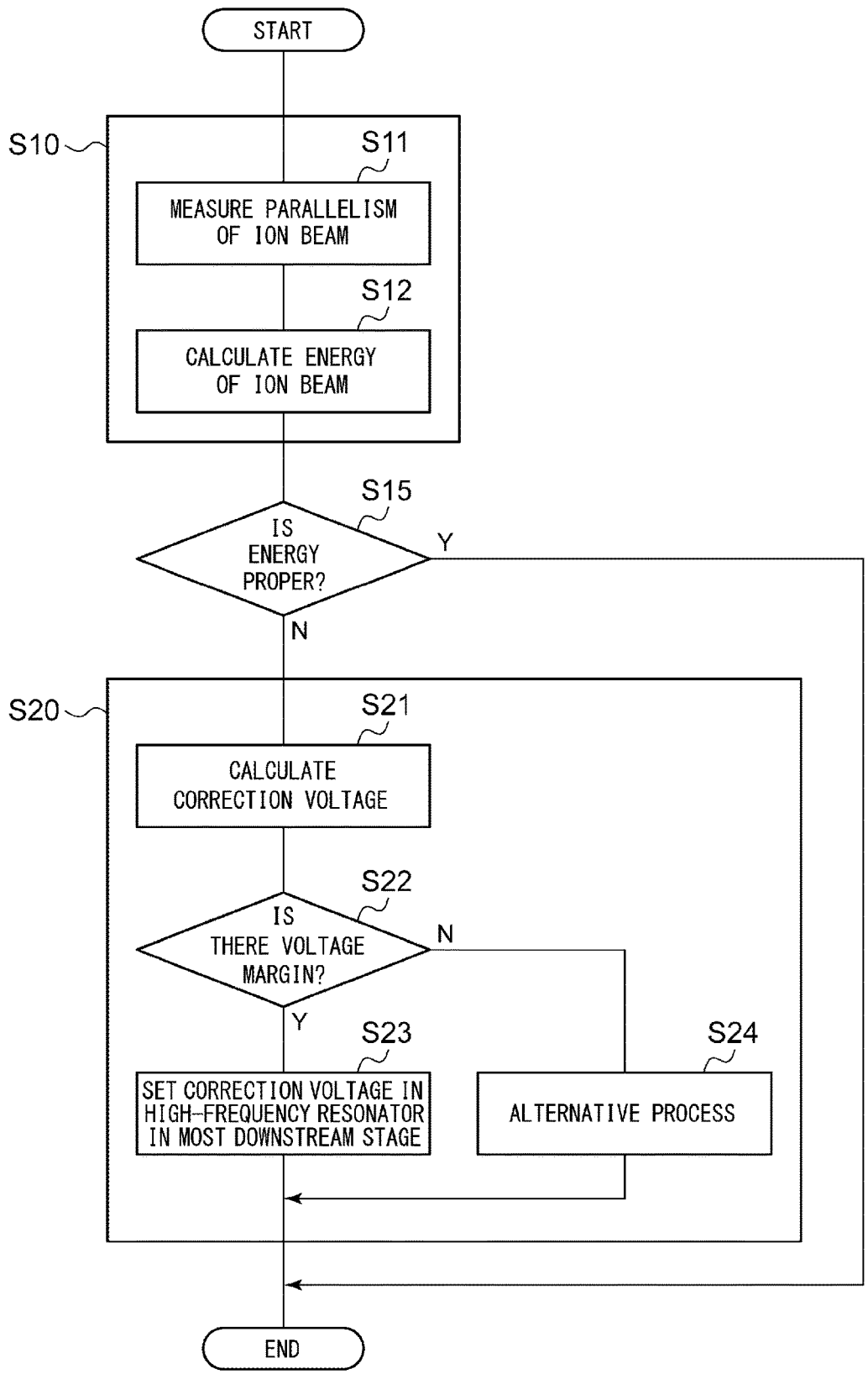
FIG. 8 is a flowchart illustrating a beam measuring method according to an embodiment of the present invention.

FIG. 8 is a flowchart illustrating a beam measuring method according to an embodiment of the present invention. The beam measuring method includes an energy measurement step (S10) and a control step (S20). For example, this method is repeatedly executed a predetermined number of times in a preparation step of the ion implantation process.

In the energy measurement step (S10), first, the parallelism measuring unit 202 of the beam energy measuring device 200 is used to measure the parallelism of the ion beam downstream of the beam parallelizer 36 of the ion implantation apparatus 100 (S11). Next, the energy calculating unit 204 of the beam energy measuring device 200 is used to calculate the energy of the ion beam from the measured parallelism (S12).

The beam energy measuring device 200 or the control unit 120 determines whether or not the measured energy of the ion beam is proper (S15). For example, the energy of the ion beam is determined to be proper when the calculated energy of the ion beam matches the target energy or when the calculated energy of the ion beam is within the allowed range near the target energy. In a case where the calculated energy of the ion beam is proper (Y in S15), adjustment of the energy of the ion beam is not necessary, and the present method is terminated. In a case where the calculated energy of the ion beam is not proper (N in S15), the control step (S20) is executed.

In the control step (S20), the high-energy multistage linear acceleration unit 14 of the ion implantation apparatus 100 is controlled based on the calculated energy of the ion beam such that the ion beam has the target energy. The control unit 120 controls the high-energy multistage linear acceleration unit 14.

First, a correction voltage is calculated based on the calculated energy of the ion beam (S21). The correction voltage is the amount of correction of an RF acceleration voltage in the high-frequency resonator in the most downstream stage in order for the ion beam to have the target energy. Next, the control unit 120 checks a voltage margin of the high-frequency resonator in the most downstream stage (S22). That is, the control unit 120 determines whether or not the high-frequency resonator in the most downstream stage can additionally generate the correction voltage. In a case where the voltage margin is greater than the correction voltage (Y in S22), the high-frequency resonator in the most downstream stage is set to generate the correction voltage (S23). Then, the energy of the ion beam is properly adjusted, and the present method is terminated. After the high-frequency resonator in the most downstream stage is set to generate the correction voltage, the energy measurement step (S10) may be executed to determine again whether or not the calculated energy of the ion beam is proper (S15).

In a case where the voltage margin of the high-frequency resonator in the most downstream stage is smaller than the correction voltage (N in S22), an alternative process for causing the ion beam to have the target energy is performed (S24). For example, the phase in at least one high-frequency resonator 14a is adjusted. Alternatively, the RF acceleration voltage may be adjusted in a high-frequency resonator other than the high-frequency resonator in the most downstream stage. The ion beam may also be caused to have the target energy by combining such an alternative process with setting a part of the correction voltage in the high-frequency resonator in the most downstream stage. Then, the present method is terminated. After the adjustment, the energy measurement step (S10) may be executed to determine again whether or not the calculated energy of the ion beam is proper (S15).

Figure 9:
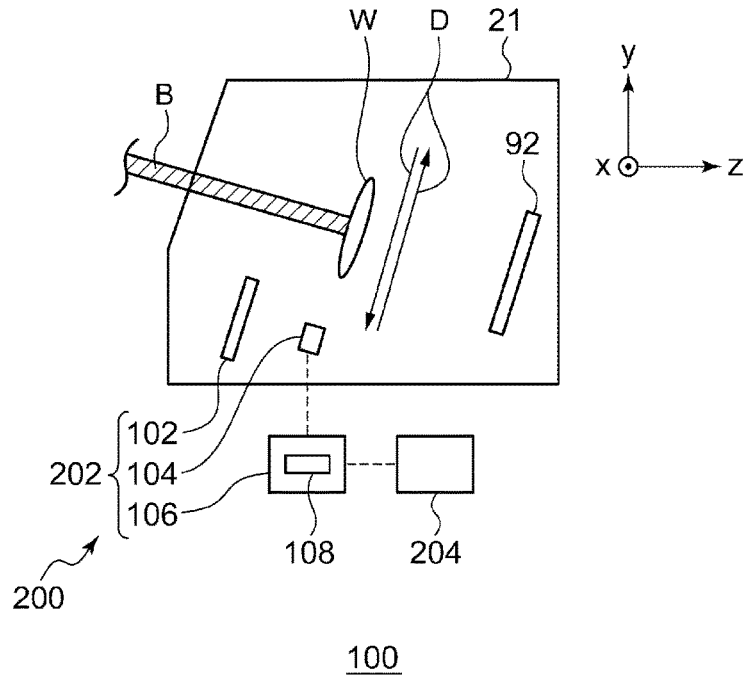
FIG. 9 is a diagram schematically illustrating one example of a beam energy measuring device according to an embodiment of the present invention.

FIG. 9 is a diagram schematically illustrating one example of the beam energy measuring device 200 according to an embodiment of the present invention. As described above, the ion implantation apparatus 100 is configured to perform an ion implantation process on the surface of the processed object W. The processed object W is, for example, a substrate and is, for example, a semiconductor wafer. Thus, in the present specification, the processed object W may be referred to as the substrate W for convenience of description. However, this is not intended to limit a target of the implantation process to a specific object.

The ion implantation apparatus 100 is configured to irradiate the entire substrate W with the ion beam B by at least one of a beam scan and a mechanical scan. For convenience of description, the present specification defines a z direction as the traveling direction of the ion beam B in design and an xy plane as a plane perpendicular to the z direction. In the case of scanning the ion beam B to the processed object W as described below, the scan direction is the x direction, and a direction perpendicular to the z direction and the x direction is a y direction. Thus, the beam scan is performed in the x direction, and the mechanical scan is performed in the y direction.

The processing chamber 21 includes an object holding unit (not illustrated) that is configured to hold one or a plurality of the substrates W and, if necessary, for example, move the substrate W relative to the ion beam B in the y direction (a so-called mechanical scan). In FIG. 9, the mechanical scan is illustrated by an arrow D. The processing chamber 21 includes a beam stopper 92. In a case where the substrate W does not exist on the ion beam B, the ion beam B is incident on the beam stopper 92.

The beam energy measuring device 200 is disposed in the processing chamber 21. As described above, the beam energy measuring device 200 includes the parallelism measuring unit 202 and the energy calculating unit 204. The parallelism measuring unit 202 includes a mask 102 that shapes the original ion beam B to a measurement ion beam Bm, and a detecting unit 104 that is configured to detect the measurement ion beam Bm.

As illustrated in FIG. 9, when the substrate W is irradiated with the ion beam B, the mask 102 and the detecting unit 104 are in a receding position separated from the ion beam B. In this case, the mask 102 and the detecting unit 104 are not irradiated with the ion beam B. When measurement is performed, the mask 102 and the detecting unit 104 are moved to a measurement position (refer to FIG. 10) extending across the ion beam B by a moving mechanism not illustrated. In this case, the mask 102 is between the final energy filter 38 (refer to FIG. 1) and the detecting unit 104 on the path of the ion beam B, and the detecting unit 104 is in a z-direction position where the surface of the substrate W is placed in the ion implantation process.

The parallelism measuring unit 202 includes a measurement control unit 106 that executes an ion beam measurement process. The measurement control unit 106 may be a part of the control device configured to control the ion implantation apparatus 100 or may be disposed separately from the control device. The energy calculating unit 204 may be a part of the measurement control unit 106 or may be disposed separately from the measurement control unit 106. The measurement control unit 106 may be configured to move the mask 102 and the detecting unit 104 between the receding position and the measurement position as described above. In an embodiment, the ion implantation apparatus 100 may be configured to control the ion implantation process based on the measurement result of the parallelism measuring unit 202.

The measurement control unit 106 includes a beam angle calculating unit 108 that is configured to calculate, based on an output of the detecting unit 104 representing a detection result, the angle between the actual traveling direction of the ion beam B and the z direction which is the traveling direction of the ion beam in design. The beam angle calculating unit 108 is configured to calculate the x-direction beam angle by using the x-direction position of the beam part of the measurement ion beam Bm passing a y slit 110y and calculate the y-direction beam angle by using the y-direction position of the beam part of the measurement ion beam Bm passing an x slit 110x.

Figure 10:
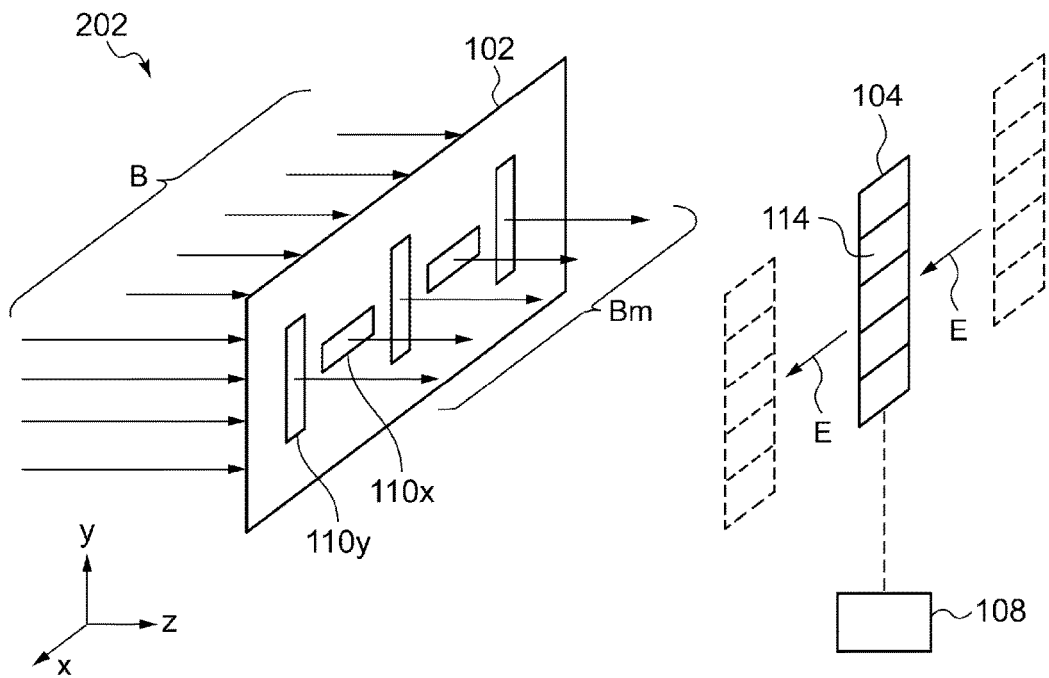
FIG. 10 is a diagram schematically illustrating a parallelism measuring unit illustrated in FIG. 9.
Figure 11:
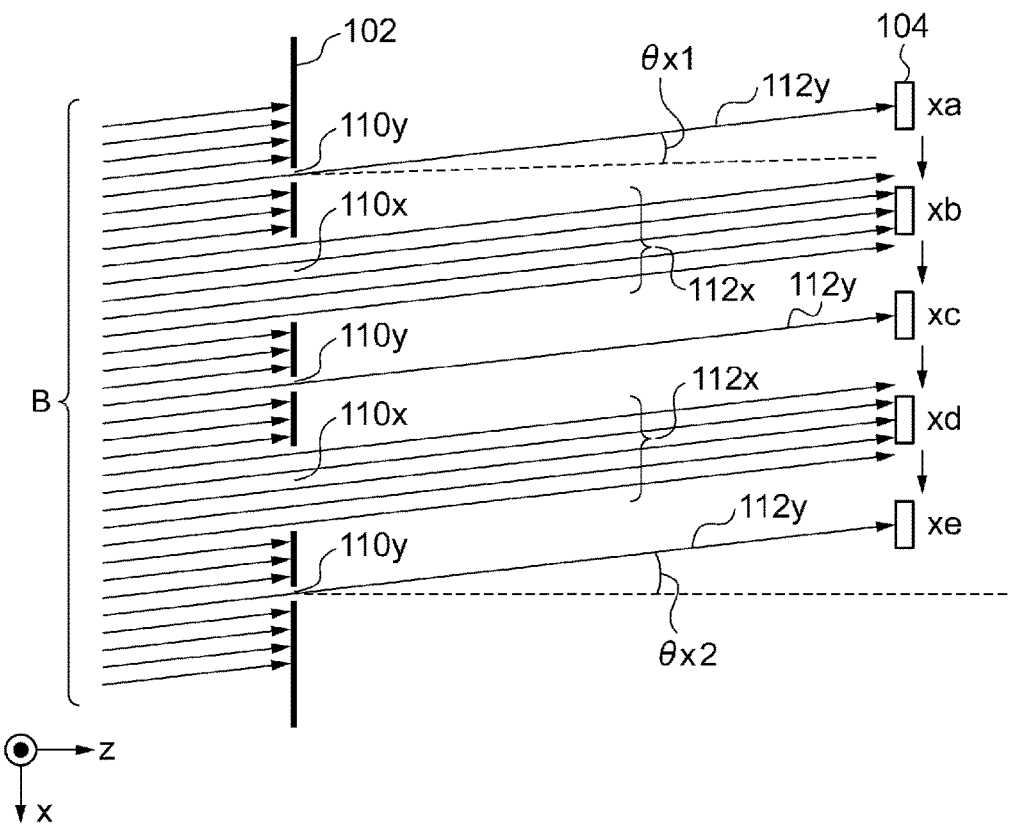
FIG. 11 is a diagram of the parallelism measuring unit illustrated in FIG. 10 that is cut along the y-direction center of a mask and seen from the y direction.
Figure 12:
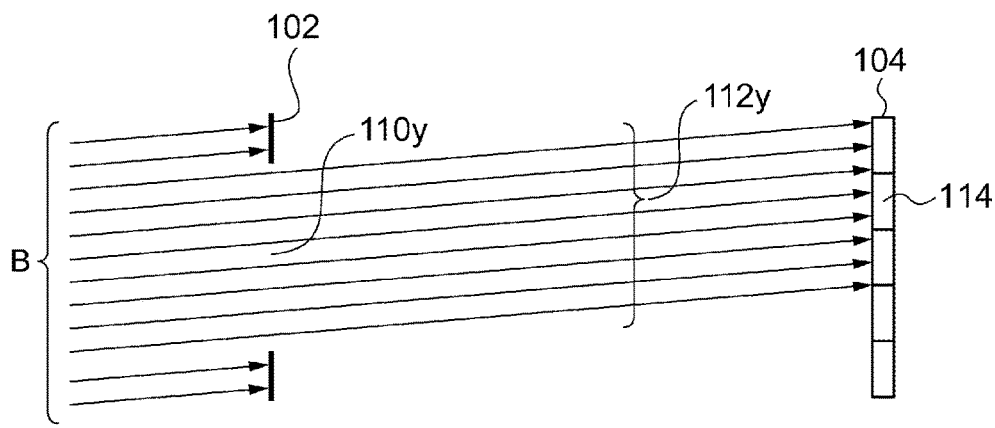
FIG. 12 is a diagram of the parallelism measuring unit illustrated in FIG. 10 that is cut in the x-direction position of a y slit of the mask and seen from the x direction.

FIG. 10 is a diagram schematically illustrating the parallelism measuring unit 202 illustrated in FIG. 9. FIG. 11 is a diagram of the parallelism measuring unit 202 illustrated in FIG. 10 that is cut along the y-direction center of the mask 102 and seen from the y direction. FIG. 12 is a diagram of the parallelism measuring unit 202 illustrated in FIG. 10 that is cut in the x-direction position of the y slit 110y of the mask 102 and seen from the x direction. FIG. 13 is a diagram of the parallelism measuring unit 202 illustrated in FIG. 10 that is cut in the x-direction position of the x slit 110x of the mask 102 and seen from the x direction.

The mask 102 is configured to generate the measurement ion beam Bm by partially transmitting the ion beam B supplied from upstream. The measurement ion beam Bm includes a y beam part 112y and an x beam part 112x (refer to FIG. 11 to FIG. 13). The y beam part 112y has a section in the xy plane, and the section is narrow and long in the y direction. The x beam part 112x has a section in the xy plane, and the section is narrow and long in the x direction.

The mask 102 includes a plate-shaped member that has a plurality of slits or openings passing the ion beam B. The plurality of slits on the mask 102 includes the y slit 110y that is narrow and long in the y direction, and the x slit 110x that is narrow and long in the x direction. In the present specification, a part of the mask 102 where the y slit 110y is formed may be referred to as a "first mask part", and a part of the mask 102 where the x slit 110x is formed may be referred to as a "second mask part".

The mask 102 illustrated in FIG. 10 includes three first mask parts and two second mask parts in an irradiated area of the mask 102 where the original ion beam B is incident. The first mask parts and the second mask parts are disposed in different positions in the x direction. Each first mask part includes one y slit 110y, and each second mask part includes one x slit 110x.

The mask 102 has three y slits 110y and two x slits 110x, and the y slits 110y and the x slits 110x are arranged in different positions in the x direction. The center y slit 110y is disposed at the x-direction center of the irradiated area of the mask 102 where the ion beam B is incident. The remaining two y slits 110y are respectively disposed in the x-direction end portions of the irradiated area of the mask 102. The two x slits 110x are in the same position in the y direction and are disposed at the y-direction center of the irradiated area of the mask 102.

Each y slit 110y is a through hole that has a shape corresponding to the y beam part 112y. Accordingly, each y slit 110y has a narrow slit width in the x direction and a slit length longer than the slit width in the y direction. Each x slit 110x is a through hole that has a shape corresponding to the x beam part 112x. Accordingly, each x slit 110x has a narrow slit width in the y direction and a slit length longer than the slit width in the x direction.

The slit length of each of the y slits 110y and the x slits 110x is noticeably longer than the slit width thereof. The slit length is, for example, at least 10 times longer than the slit width. The slit width is desirably narrow in the case of prioritizing the accuracy of measurement. The slit width is desirably wide in the case of prioritizing shortening measurement time. The slit length of each y slit 110y is determined in accordance with the y-direction width of the ion beam B.

The interval between two adjacent slits of the mask 102 is determined such that adjacent two beam parts are separated from each other when the measurement ion beam Bm is incident on the detecting unit 104. As illustrated in FIG. 11, the x-direction interval between the adjacent y slit 110y and the x slit 110x is determined such that the adjacent y beam part 112y and the x beam part 112x do not overlap with each other in the z-direction position of the detecting unit 104. Accordingly, adjacent beam parts can be prevented from being mixed with each other due to divergence of each beam part while each beam part reaches the detecting unit 104 from the mask 102.

Each first mask part is irradiated with the ion beam B, and the ion beam B passes each y slit 110y, thereby generating the y beam part 112y. Each second mask part is irradiated with the ion beam B, and the ion beam B passes each x slit 110x, thereby generating the x beam part 112x. The measurement ion beam Bm in which three y beam parts 112y and two x beam parts 112x are arranged in different positions in the x direction is generated in correspondence with the arrangement of the y slits 110y and the x slits 110x on the mask 102.

The mask 102 does not move while the detecting unit 104 performs detection. Thus, the y beam parts 112y and the x beam parts 112x correspond to specific parts of the original ion beam B. Accordingly, the y beam parts 112y and the x beam parts 112x maintain the beam angle in specific positions in the ion beam B in the xy plane.

The detecting unit 104 is configured to detect the x-direction position of each y beam part 112y and detect the y-direction position of each x beam part 112x. The detecting unit 104 includes a moving detector that can move in the x direction across the measurement ion beam Bm. Movement of the detecting unit 104 in the x direction is illustrated by an arrow E in FIG. 10. The x-direction position of each y beam part 112y is detected by movement of the detector in the x direction. The detecting unit 104 includes a plurality of detecting elements 114 arranged in the y direction. The y-direction position of each x beam part 112x is detected from the position in the detecting unit 104 where each x beam part 112x reaches.

The detecting unit 104 can detect the x-direction position of each y beam part 112y and the y-direction position of each x beam part 112x while the moving detector moves across the measurement ion beam Bm once.

The detecting unit 104 or each detecting element 114 includes, for example, an element that generates a current in accordance with the amount of incident ions. Alternatively, the detecting unit 104 or each detecting element 114 may have any configuration that can detect the ion beam. The detecting unit 104 or each detecting element 114 may be, for example, a Faraday cup. While the detecting unit 104 illustrated representatively includes five detecting elements 114, the detecting unit 104 may typically include an arrangement of more (for example, at least 10) detecting elements 114.

As illustrated in FIG. 11, when the detecting unit 104 moves in the x direction in order to detect the measurement ion beam Bm, for example, in an x-direction position xa, the detecting unit 104 receives the y beam part 112y from the y slit 110y in the x-direction end portion of the mask 102. The detecting unit 104, for example, in an x-direction position xb, receives the x beam part 112x from one x slit 110x. The detecting unit 104, for example, in an x-direction position xc, receives the y beam part 112y from the y slit 110y at the center in the x direction. Similarly, the detecting unit 104, for example, in an x-direction position xd, receives the x beam part 112x from the other x slit 110x and, for example, in an x-direction position xe, receives the y beam part 112y from the y slit 110y in the x-direction end portion of the mask 102.

The detecting unit 104 outputs a relationship between the x-direction position and the beam current acquired as a result of movement in the x direction to the beam angle calculating unit 108. The beam angle calculating unit 108 specifies the x-direction position of each y beam part 112y from the relationship between the x-direction position and the beam current. The beam angle calculating unit 108 determines the x-direction position of each y beam part 112y as, for example, the x-direction position of a beam current peak corresponding to each y beam part 112y.

As illustrated in FIG. 12, the y beam parts 112y are incident on several detecting elements 114 arranged in the y direction. Therefore, in the present embodiment, the total of the beam currents output from the individual detecting elements 114 is calculated, and the total beam current is used for specifying the x-direction position of each y beam part 112y.

As known previously, an x-direction beam angle θx can be calculated from the ratio of the amount of beam displacement in the x direction between a first position and a second position in the z direction and the z-direction distance between the first position and the second position. Since the mask 102 is held in a specified place during detection, the z-direction position of each slit on the mask 102 and the position of each slit in the xy plane in the z-direction position are previously known. The z-direction position of the detecting unit 104 is also previously known. Accordingly, the x-direction beam angle θx can be calculated by using the previously known positional relationship and the detected x-direction position of each y beam part 112y.

The beam parallelism may be defined as, for example, an angular difference δθ between two measurement points=θx1−θx2. The interval between the measurement points is desirably as large as possible in the scan plane. The reason is because in a case where the beam has a converging trajectory or a diverging trajectory, a larger angular difference is achieved in measurement positions that are separated as far as possible. Thus, sensitivity is increased.

The x-direction width of each y beam part 112y is narrow in correspondence with the x-direction width of each y slit 110y as illustrated in FIG. 11. Accordingly, the x-direction position of the beam current peak corresponding to each y beam part 112y is easily specified. Each y beam part 112y is wide in the y direction in correspondence with each y slit 110y as illustrated in FIG. 12. Thus, the detecting unit 104 can receive more beam current than in the case of using a mask having a small circular hole as in the related art.

A y-direction beam angle θy can be calculated from the ratio of the amount of beam displacement in the y direction between the first position and the second position in the z direction and the z-direction distance between the first position and the second position. As illustrated in FIG. 13, the y-direction width of each x beam part 112x is narrow in correspondence with the y-direction width of each x slit 110x. If the x beam parts 112x reach specific detecting elements 114 of the detecting unit 104, the y-direction position of each detecting element 114 can be regarded as the y-direction position of each x beam part 112x. The y-direction beam angle θy can be calculated by using the detected y-direction position of each x beam part 112x and the previously known positional relationship between the mask 102 and the detecting unit 104. As illustrated in FIG. 11, each x beam part 112x is wide in the x direction in correspondence with each x slit 110x. Thus, the beam current received by the detecting unit 104 can be increased.

Forming x-direction slits and y-direction slits in the single mask 102 enables measuring the x-direction beam angle θx and the y-direction beam angle θy at the same time in one mask 102.

An x-direction distribution of the x-direction beam angle θx of the ion beam B can be acquired by disposing the plurality of y slits 110y in different positions in the x direction. For example, the x-direction beam angle θx acquired from the center y beam part 112y can be used as a representative value of the x-direct ion beam angle of the ion beam B. In addition, for example, the difference between the representative value and the x-direction beam angle θx acquired from the y beam part 112y in each end portion can be used as an indicator representing uniformity of the x-direction beam angle θx.

An x-direction distribution of the y-direction beam angle θy of the ion beam B can be acquired by disposing the plurality of x slits 110x in different positions in the x direction.

In the above embodiment, the detecting unit 104 moves in the x direction at a constant speed. This has an advantage of simplifying operation of the detecting unit 104. However, in an embodiment, the detecting unit 104 may be configured to adjust the speed of movement of the moving detector while the moving detector moves across the measurement ion beam Bm once, in order to increase the intensity of the beam current received by the detecting unit 104. For example, the moving detector may decelerate or do not move in order to receive the x beam parts 112x. Specifically, for example, the moving detector may decelerate immediately before receiving each x beam part 112x and continue decelerating until passing each x beam part 112x. Alternatively, the moving detector may stop for a predetermined amount of time in a position of receiving each x beam part 112x.

FIG. 14 is a flowchart illustrating one example of a parallelism measurement process using the parallelism measuring unit 202 illustrated in FIG. 9. First, a mask is set in a position where an ion beam passes (S31). This operation is mechanically performed. As described above, y slits and x slits are disposed in the mask. Then, the mask is held in the position until the present method is terminated, and the mask does not move during measurement.

Next, ion beam irradiation is initiated (S32). A measurement ion beam is prepared by passing the ion beam through the slits of the mask. As described above, the measurement ion beam includes y beam parts that are long in the y direction perpendicular to the traveling direction of the ion beam, and x beam parts that are long in the x direction perpendicular to the traveling direction of the ion beam and the y direction.

Next, the beam angle is measured (S33). The position where the ion beam passing the mask reaches is measured by using a detecting unit. The x-direction position of each y beam part is detected, and the y-direction position of each x beam part is detected. In this case, the detecting unit is moved with respect to the measurement ion beam if necessary. The x-direction beam angle (that is, the parallelism) is calculated by using the detected x-direction position, and the y-direction beam angle is calculated by using the detected y-direction position. Then, the ion beam irradiation is terminated (S34), and finally, the set mask is released (S35). The mask returns to the receding position. Then, the present method is terminated.

While the ion implantation apparatus 100 in the above embodiment includes the electrostatic beam parallelizer 36, the present invention is not limited thereto. In an embodiment, the ion implantation apparatus 100 may include a magnetic field beam parallelizer. In this case, the energy of the ion beam can be measured in the same manner by replacing the voltage with a magnetic field in the above description.

In an embodiment, the measured energy of the ion beam may be used for controlling a component of the ion implantation apparatus 100 other than the high-energy multistage linear acceleration unit 14.

In an embodiment, the ion implantation apparatus 100 may be configured to provide, to the processing chamber 21, an ion beam referred to as a ribbon beam that has a long section in one direction perpendicular to the z direction. In this case, the ion beam has, for example, an x-direction width that is longer than the y-direction width of the ion beam. Thus, a beam energy measuring device may include a parallelism measuring unit that measures the parallelism of the ribbon beam downstream of a beam parallelizer, and an energy calculating unit that calculates the energy of the ion beam from the measured parallelism.

Next, a method for adjusting the high-frequency parameters of the high-energy multistage linear acceleration unit 14 will be described in detail. In the present embodiment, the high-energy multistage linear acceleration unit 14 has n stages (for example, 18 stages) of high-frequency resonators. For example, the first linear accelerator 15a in the upstream stage has m stages (for example, 12 stages) of high-frequency resonators, and the second linear accelerator 15b in the downstream stage has nm stages (for example, six stages) of high-frequency resonators. An electrode to which an electrostatic voltage is applied (typically a ground electrode) is disposed between each stage of the high-frequency resonators. A difference in electric potential applied in the gap between the electrode and each high-frequency resonator is used to accelerate or decelerate the ion beam passing the gap. The electrode disposed between each stage of the high-frequency resonators can also function as a Q lens (converging or diverging lens). For example, a beam profile of the ion beam passing the high-energy multistage linear acceleration unit 14 can be controlled by adjusting Q lens parameters that set an applied voltage. By appropriately adjusting the Q lens parameters, for example, the generated beam can be adjusted to maximize the intensity of the beam current generated by the high-energy multistage linear acceleration unit 14.

The amount of acceleration energy of the high-energy multistage linear acceleration unit 14 as a whole acceleration unit is controlled by adjusting the high-frequency parameters that determine the voltage amplitude, the frequency, and the phase of each stage of the high-frequency resonators. The values of the high-frequency parameters are calculated by optimization using a predetermined algorithm that takes the target beam energy as an input. For example, appropriate high-frequency parameters are set for a simulation model that simulates the optical arrangement of the high-energy multistage linear acceleration unit 14, and the value of the generated energy is calculated by changing the values of the high-frequency parameters. Accordingly, the high-frequency parameters for acquiring the target beam energy are calculated. If an execution result of optimization performed in the past exists, the result can be used to calculate the high-frequency parameters.

The high-frequency resonator in the most upstream stage (for example, the first stage and the second stage) of the plurality of stages of high-frequency resonators performs "bunching" that causes a continuous beam (DC beam) extracted from the ion source 10 by the extraction electrode 11 having an electrostatic voltage to have a specific fixed acceleration phase. Accordingly, the high-frequency resonator in the most upstream stage is referred to as a "buncher". The buncher affects a beam capture efficiency in the high-frequency resonators on the downstream side and significantly affects the intensity of the beam current generated by the high-energy multistage linear acceleration unit 14. In optimization of the high-frequency parameters, a combination of phases achieving an optimal transfer efficiency is derived by performing simulation by changing the phase of the buncher.

Desired beam energy may not be acquired even if the high-energy multistage linear acceleration unit 14 is operated based on the above high-frequency parameters acquired by optimization. Examples of several causes considered include error in manufacturing or attachment of a high-frequency electrode in the high-frequency resonators and error in the amplitude of a high-frequency voltage applied to the high-frequency electrode. While it is sufficient to have the difference between the target value and the actual measured value of the beam energy within the allowed range, there is increasing need for the accuracy of the energy of the beam in recent years, and fine adjustment of the high-frequency parameters is required in order to have the value of the beam energy within the allowed range. In this case, the energy of the beam may be finely adjusted if a margin for generating the correction voltage exists as described in the process of S22 in FIG. 8. However, if there is no margin, fine adjustment of the energy of the beam is not easily performed, and time-taking optimization has to be executed again.

In the present embodiment, tentative high-frequency parameters are acquired by executing optimization under a constraint that the high-frequency parameters of the high-frequency resonator in a part of the plurality of stages of high-frequency resonators including at least the most downstream stage have values different from the high-frequency parameters for achieving the maximum acceleration in design. The "values different from the high-frequency parameters for achieving the maximum acceleration in design" are parameter values that are intentionally caused to deviate from the optimal values for achieving the maximum acceleration. By setting parameters that are intentionally caused to deviate from the optimal values, an adjustment margin for finely adjusting the energy of the beam can be achieved. Consequently, the value of the energy of the generated beam can be finely adjusted by just adjusting the parameters of the high-frequency resonator in a part including at least the most downstream stage. Accordingly, according to the present embodiment, time-consuming optimization is not required to be repeated, and a beam having accurate energy can be more simply acquired.

Figure 15:
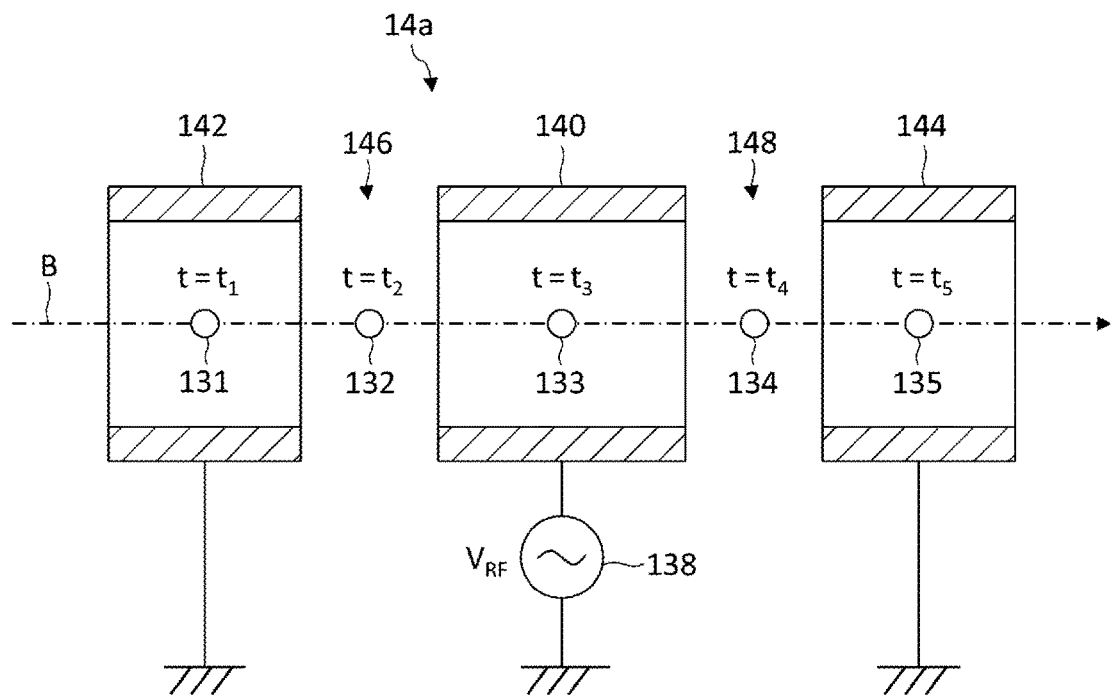
FIG. 15 is a diagram schematically illustrating a principle of acceleration and deceleration of a beam by a high-frequency resonator.

FIG. 15 is a diagram schematically illustrating a principle of acceleration and deceleration of the beam by each high-frequency resonator 14a. A high-frequency electrode 140 has a cylindrical shape. The ion beam B passes the cylindrical inside of the high-frequency electrode 140. A high-frequency power source 138 is connected to the high-frequency electrode 140, and a high-frequency voltage $V_{RF}$ having the voltage amplitude, the frequency, and the phase set in the high-frequency parameters is applied to the high-frequency electrode 140. A first electrode 142 is disposed on the upstream side of the high-frequency electrode 140, and a second electrode 144 is disposed on the downstream side of the high-frequency electrode 140. An electrostatic voltage is applied to the first electrode 142 and the second electrode 144. For example, a ground voltage is applied thereto. A quadrupole electrode that functions as a Q lens may be disposed inside the first electrode 142 and the second electrode 144. The quadrupole electrode may be the horizontal converging (vertical diverging) lens QF that causes the beam to converge in the x direction orthogonal with respect to the beam trajectory, or the vertical converging (horizontal diverging) lens QD that causes the beam to converge in the y direction.

A first gap 146 is disposed between the high-frequency electrode 140 and the first electrode 142. An electric field caused by a difference in electric potential between the high-frequency electrode 140 and the first electrode 142 is generated in the first gap 146. Similarly, a second gap 148 is disposed between the high-frequency electrode 140 and the second electrode 144, and an electric field caused by a difference in electric potential between the high-frequency electrode 140 and the second electrode 144 is generated in the second gap 148. An ion 132 that is positioned in the first gap 146 is accelerated or decelerated by receiving the electric field generated in the first gap 146. Similarly, an ion 134 that is positioned in the second gap 148 is accelerated or decelerated by receiving the electric field generated in the second gap 148. The high-frequency electrode 140, the first electrode 142, and the second electrode 144 have substantially equal electric potential. Thus, ions 131, 133, and 135 passing through the first electrode 142, the high-frequency electrode 140, and the second electrode 144 are substantially not accelerated or decelerated.

Figure 16:
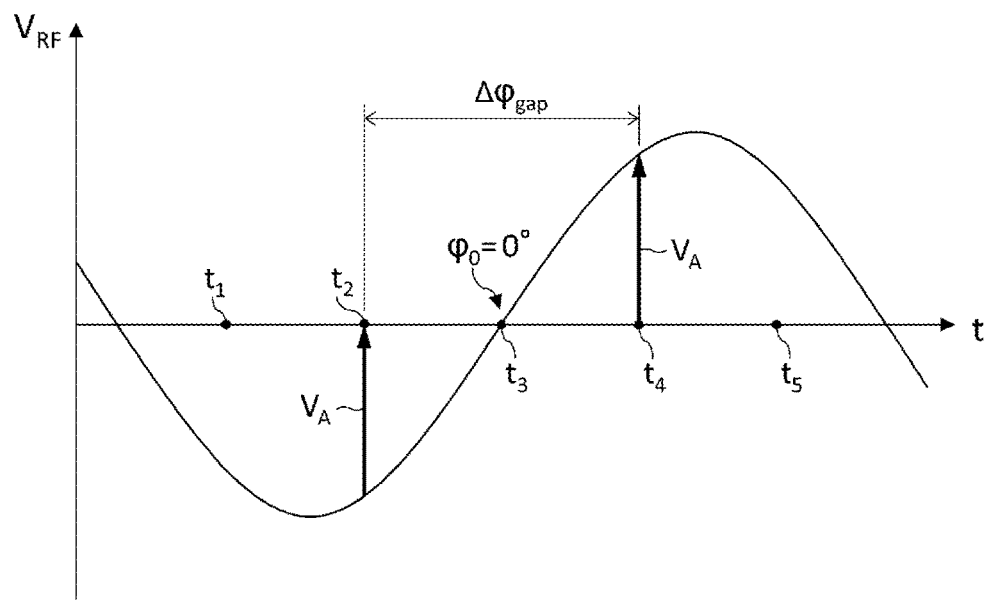
FIG. 16 is a graph schematically illustrating one example of a temporal waveform of a high-frequency voltage and energy received by ions passing the high-frequency resonator.

FIG. 16 is a graph schematically illustrating one example of a temporal waveform of the high-frequency voltage $V_{RF}$ and energy received by the ions passing through each gap of the high-frequency resonator 14*a*. Time points t=$t_1$, $t_2$, $t_3$, $t_4$, and $t_5$ illustrated in the graph respectively correspond to time points at which the ions 131 to 135 illustrated in FIG. 15 pass the first electrode 142, the first gap 146, the high-frequency electrode 140, the second gap 148, and the second electrode 144. In the present specification, a phase $\varphi_0$ of the high-frequency voltage $V_{RF}$ when the ion 133 passes the high-frequency electrode 140 (t=$t_3$) is referred to as an "acceleration phase". The value of the acceleration phase is controlled as one of the values of the high-frequency parameters. If the acceleration phase $\varphi_0$ is changed, the amount of acceleration and deceleration energy of the beam generated by passing each high-frequency resonator 14*a* is changed. Accordingly, the acceleration phase $\varphi_0$ is one of important parameters for controlling the value of the beam energy.

FIG. 16 illustrates a case where the acceleration phase is set as $\varphi_0=0°$. In this case, the high-frequency voltage $V_{RF}$ has a negative value ($-V_A$) at the time point t=$t_2$ when the ion 132 passes the first gap 146 upstream of the high-frequency electrode 140. The high-frequency voltage $V_{RF}$ has a positive value ($+V_A$) at the time point t=$t_4$ when the ion 134 passes the second gap 148 downstream of the high-frequency electrode 140. At the time point t=$t_2$, the electric potential of the first electrode 142 (ground) is higher than the electric potential of the high-frequency electrode 140 ($-V_A$). Thus, the ion 132 acquires acceleration energy caused by the electric potential difference $V_A$. At the time point t=$t_4$, the electric potential of the second electrode 144 (ground) is higher than the electric potential of the high-frequency electrode 140 ($+V_A$). Thus, the ion 134 acquires acceleration energy caused by the electric potential difference $V_A$. Consequently, acceleration energy corresponding to a voltage of total $2V_A$ is acquired through both of the first gap 146 and the second gap 148.

In a case where the acceleration phase $\varphi_0$ is fixed, the value of the acceleration energy achieved by each high-frequency resonator 14*a* depends on the voltage amplitude of the high-frequency voltage $V_{RF}$ and a phase difference $\Delta\varphi_{gap}$ generated while ions reach the second gap 148 from the first gap 146. The phase difference $\Delta\varphi_{gap}$ is determined by an electrode length $L_0$ of the high-frequency electrode 140, a gap length $L_1$ of the first gap 146, a gap length $L_2$ of the second gap 148, the passing speed (average speed v) of ions, and the frequency f of the high-frequency voltage $V_{RF}$. The phase difference $\Delta\varphi_{gap}$, if schematically calculated, corresponds to an amount of passage time $\tau \approx (L_0+L_1/2+L_2/2)/v$ from the first gap 146 to the second gap 148. The passing speed (average speed v) of ions is determined by the mass and the energy of the ions. In the high-frequency linear accelerator, by considering these various parameters, the high-frequency parameters of each high-frequency resonator 14*a* are determined such that desired acceleration energy is acquired.

Figure 17:
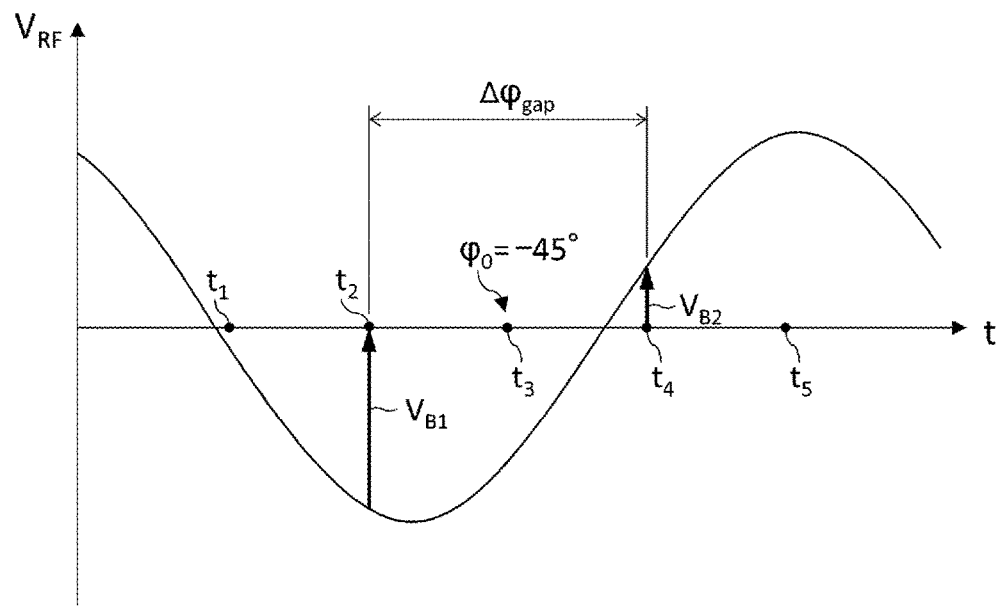
FIG. 17 is a graph schematically illustrating one example of a temporal waveform of a high-frequency voltage and energy received by ions passing the high-frequency resonator.

FIG. 17 is a graph schematically illustrating one example of a temporal waveform of the high-frequency voltage $V_{RF}$ and energy received by ions passing each high-frequency resonator 14*a* and illustrates a case where the acceleration phase is set as $\varphi_0=-45°$. The amplitude and the frequency of the high-frequency voltage $V_{RF}$ and the phase difference $\Delta\varphi_{gap}$ from the first gap 146 to the second gap 148 are the same as in FIG. 16. A difference in phase generates acceleration energy caused by an electric potential difference $V_{B1}$ in the first gap 146 (t=$t_2$) and acceleration energy caused by an electric potential difference $V_{B2}$ in the second gap 148 (t=$t_4$). Acceleration energy corresponding to a voltage of total $V_{B1}+V_{B2}$ is acquired. The acceleration energy is smaller than the acceleration energy corresponding to a voltage of $2V_A$ illustrated in FIG. 16.

Figure 18:
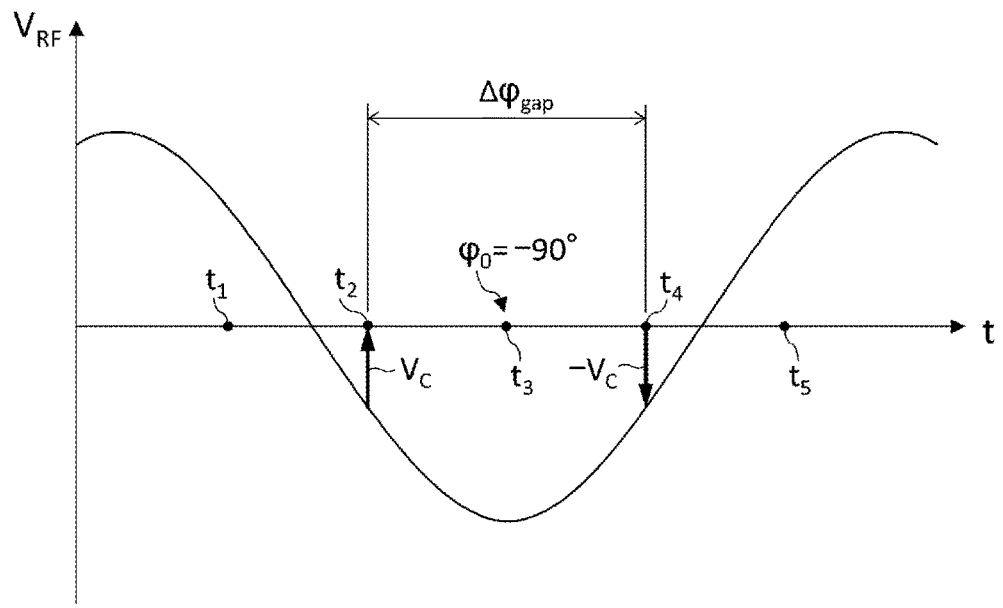
FIG. 18 is a graph schematically illustrating one example of a temporal waveform of a high-frequency voltage and energy received by ions passing the high-frequency resonator.

FIG. 18 is a graph schematically illustrating one example of a temporal waveform of the high-frequency voltage $V_{RF}$ and energy received by ions passing each high-frequency resonator 14*a* and illustrates a case where the acceleration phase is set as $\varphi_0=-90°$. The amplitude and the frequency of the high-frequency voltage $V_{RF}$ and the phase difference $\Delta\varphi_{gap}$ from the first gap 146 to the second gap 148 are the same as in FIG. 16. A 90° difference in phase generates acceleration energy caused by an electric potential difference $V_C$ in the first gap 146 (t=$t_2$) and deceleration energy caused by an electric potential difference $-V_C$ in the second gap 148 (t=$t_4$). Consequently, the total acceleration and deceleration energy acquired is equal to zero.

The amount of acceleration and deceleration energy generated by each high-frequency resonator 14*a* can be adjusted by adjusting the acceleration phase $\varphi_0$ of each high-frequency resonator 14*a*.

Figure 19:
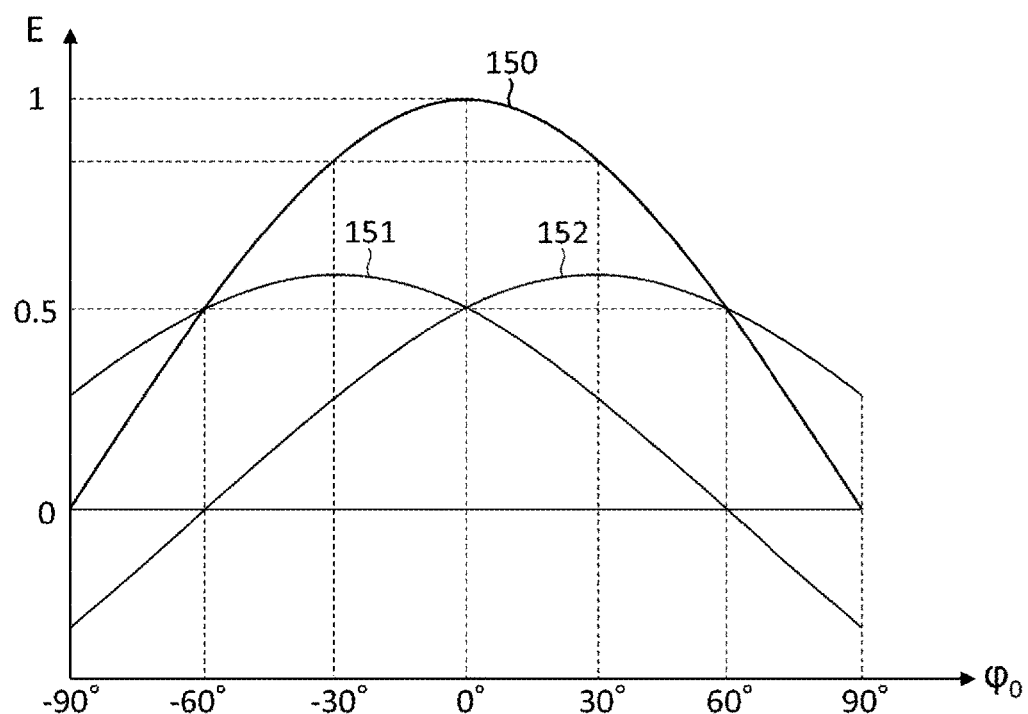
FIG. 19 is a graph schematically illustrating one example of a relationship between an acceleration phase and acceleration and deceleration energy.

FIG. 19 is a graph schematically illustrating one example of a relationship between the acceleration phase $\varphi_0$ and acceleration and deceleration energy E. Curves 151 and 152 illustrated by thin lines in the graph respectively illustrate acceleration and deceleration energy E1 in the first gap 146 and acceleration and deceleration energy E2 in the second gap 148. A curve 150 illustrated by a thick line illustrates total acceleration and deceleration energy E0 (=E1+E2) in each high-frequency resonator 14*a*. The range of the acceleration phase $\varphi_0$ in which the total acceleration and deceleration energy E0 is positive ($-90° \leq \varphi_0 \leq 90°$) is illustrated in the graph.

As illustrated in FIG. 19, the acquired acceleration energy is maximum at the acceleration phase $\varphi_0=0°$. The acquired acceleration energy is decreased in accordance with a difference in the acceleration phase $\varphi_0$, and the acceleration energy is equal to zero at the acceleration phase $\varphi_0=\pm 90°$. The acquired acceleration energy is half of the maximum value thereof at the acceleration phase $\varphi_0=\pm 60°$. In the range of the acceleration phase $\varphi_0$ not illustrated ($-180° \leq \varphi_0 < -90°$ and $90° < \varphi_0 < 180°$), the sign of the acquired energy is reversed, and negative energy that decelerates ions is achieved.

In the graph illustrated in FIG. 19, if the acceleration phase calculated by optimization is $\varphi_0=0°$, that is, a value for achieving the maximum acceleration, the amount of energy of the ion beam may be decreased by adjusting the acceleration phase $\varphi_0$ but cannot be increased. That is, setting a maximum acceleration condition for acquiring a high-energy beam leads to diminishing a margin for slightly increasing the energy of the ion beam. If the acceleration phase deviates from the maximum acceleration condition, the energy of the ion beam can be adjusted in either an increasing manner or a decreasing manner. For example, if a reference value of the acceleration phase $\varphi_0$ (referred to as a reference phase) is set within a range of $-90°$ to $-30°$ (or a range of 30° to 90°), the energy of the ion beam can be increased or decreased by a certain percentage. Particularly, the reference phase is preferably set to $-60°$ (or $+60°$) because a margin for increasing or decreasing the energy of the ion beam by changing the acceleration phase $\varphi_0$ can be increased.

Fine adjustment of the energy of the ion beam by changing the high-frequency parameters is preferably performed for the high-frequency resonator in the most downstream stage of the plurality of stages of high-frequency resonators. The reason is because if the high-frequency parameters on the upstream side are changed, the parameters of the high-frequency resonator positioned downstream of the high-frequency resonator having the adjusted parameters may be checked again. The high-frequency resonator in the most downstream does not have a high-frequency resonator downstream thereof. Thus, adjustment of the parameters on the downstream side in accordance with a change in the parameters on the upstream side is not required.

For example, in a case where the high-energy multistage linear acceleration unit 14 has 18 stages of high-frequency resonators, the most upstream two stages of which are used as a buncher, the most downstream one stage of which adjusts the energy of the ion beam, and the remaining 15 stages of which accelerate the ion beam, the amount of acceleration energy in each stage is approximately 4% to 8% of the final beam energy. In this case, if the acceleration phase $\varphi_0$ of the high-frequency resonator in the most downstream stage is set to −60° (or +60°), an adjustment margin of approximately half of the amount of acceleration energy in each stage, that is, approximately ±2% to ±4%, can be achieved.

If the adjustment margin corresponding to one stage is considered insufficient, the energy of the beam may be adjusted by using two or more stages of high-frequency resonators including the most downstream stage. In this case, the final beam energy may be adjusted by setting the acceleration phase $\varphi_0$ to a reference value deviating from the maximum acceleration condition and adjusting the acceleration phase $\varphi_0$ of each of the two or more stages of high-frequency resonators after measuring the beam energy. The parameters of the two or more stages of high-frequency resonators may be adjusted at the same time or individually adjusted. For example, the beam energy may be measured again after adjusting the stage immediately before the most downstream stage (for example, the 17th stage), and then, the beam energy may be confirmed by adjusting the most downstream stage (for example, the 18th stage).

In the case of using the energy adjustment method according to the present embodiment, the acceleration energy in the most downstream stage has to be restricted. Thus, the maximum acceleration in design cannot be achieved. Therefore, in a case where the absolute amount of the beam energy is further prioritized than the accuracy of the energy of the beam, optimization may be executed under a constraint that the acceleration phase $\varphi_0$ in the most downstream stage is set as the maximum acceleration condition. In this case, while it is difficult to finely adjust the energy of the beam in an increasing manner in the most downstream stage, a beam having the highest energy possible can be generated. A first mode in which the energy of the beam can be finely adjusted and a second mode in which high energy can be generated though it is difficult to finely adjust the energy of the beam may be prepared to enable a user to choose the mode in which the high-frequency parameters are set.

The energy of the beam may also be finely adjusted by changing the voltage amplitude of the high-frequency voltage $V_{RF}$ of the high-frequency parameters instead of the acceleration phase. For example, the energy of the beam may be adjusted by setting the voltage amplitude of the high-frequency resonator in the most downstream stage to a value lower than the maximum value of the voltage amplitude in design and changing the voltage amplitude after measuring the beam energy. For example, the adjustment margin may be achieved by changing the voltage amplitude by optimization under a constraint that the voltage amplitude of the most downstream stage is half of the maximum value of the voltage amplitude in design. In this case, the beam energy may be adjusted by changing both of the acceleration phase and the voltage amplitude, or the beam energy may be adjusted by changing only the voltage amplitude.

The amount of change in beam energy when the high-frequency parameters of the most downstream stage are changed in a stepwise manner from reference values may be calculated in order to support adjustment of the high-frequency parameters. For example, a plurality of beam energy values that may be acquired when the phase value of the acceleration phase $\varphi_0$ having a reference value of −60° is changed by 10° in a range of −90° to 0° is calculated. In this case, the plurality of beam energy values may be calculated by using a simulation model at the same time as optimization or may be calculated by applying the correlation between the acceleration phase and the acceleration energy illustrated in FIG. 19 to the actual measured value of the beam energy. The plurality of beam energy values may be calculated in more steps (for example, by 5°) in a range of −90° to −60° where the amount of change in beam energy is relatively large with respect to a change in phase, and calculated in less steps (for example, by 10°) in a range of −60° to 0° where the amount of change in beam energy is relatively small. Besides, the pitch of the change in acceleration phase $\varphi_0$ may be set such that a uniform amount of change in energy is achieved.

The control operation device 54 may adjust the parameters by choosing a value close to the target value from the calculated plurality of beam energy values and changing the acceleration phase $\varphi_0$ to a value corresponding to the chosen beam energy value. The control operation device 54 may enable the user to choose the value by displaying the calculated plurality of beam energy values on the display device 68. The control operation device 54 may allow the user to choose any of the plurality of beam energy values presented as choices through the input device 52 and employ parameters corresponding to the chosen value of the beam energy as parameters after adjustment.

In the energy adjustment method according to the present embodiment, the beam energy is required to be accurately measured in order to accurately adjust the beam energy. While a method for measuring the beam energy is not particularly limited, the beam energy can be accurately specified based on the measurement of the beam parallelism described above. Besides, the beam energy may be specified based on measurement of the time-of-flight (TOF) of the ion beam generated by the high-energy multistage linear acceleration unit 14. The beam energy may be specified by measuring the energy of a characteristic X-ray of a target such as a wafer irradiated with the beam. The beam energy may be specified based on measurement of a secondary ion mass spectrometry (SIMS) profile of the irradiation target.

The amount of the beam energy is changed from the value before adjustment in a case where adjustment of the beam energy is completed. Thus, operating parameters of devices positioned downstream of the high-energy multistage linear acceleration unit 14 may not be optimized. For example, a magnetic field parameter of the energy analysis electromagnet 24 or the deflecting electromagnet 30 is required to be adjusted in accordance with the energy of the passing beam. A voltage parameter of the beam parallelizer 36 or the final energy filter 38 may also be required to be adjusted. Therefore, beam transfer may be further optimized by adjusting the parameters of devices positioned downstream of the high-energy multistage linear acceleration unit 14 in accordance with the amount of adjustment of the beam energy.

Figure 20:
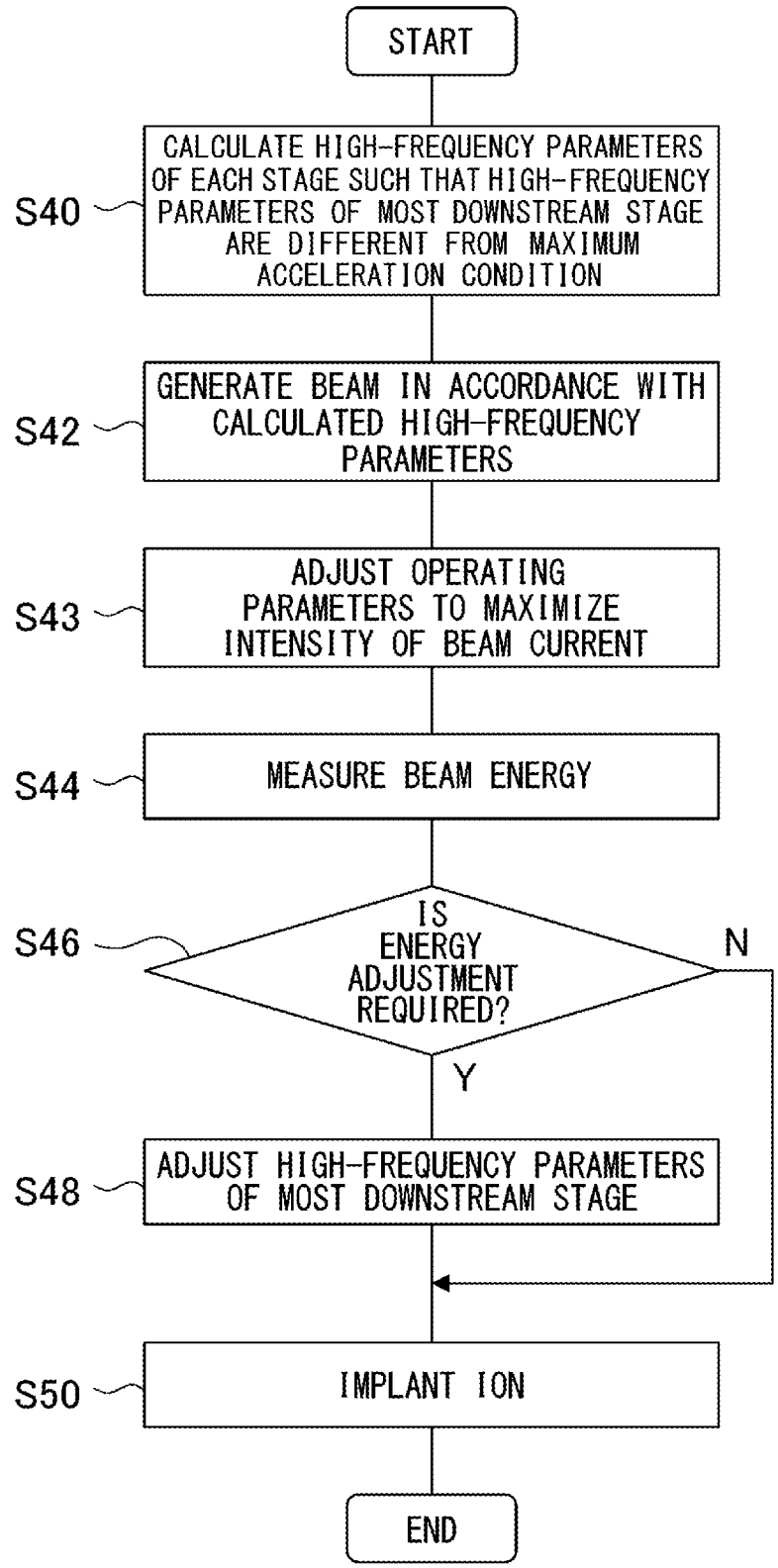
FIG. 20 is a flowchart illustrating an ion implantation method according to an embodiment.

Next, an ion implantation method according to the present embodiment will be described. FIG. 20 is a flowchart illustrating an ion implantation method according to an embodiment. The control operation device 54 receives input of the target beam energy and calculates tentative high-frequency parameters of each stage under a constraint that the high-frequency parameters of the high-frequency resonator in a part of the plurality of stages of high-frequency resonators including at least the most downstream stage have values different from the high-frequency parameters for achieving the maximum acceleration (S40). The control operation device 54 calculates high-frequency parameters such that the target beam energy is acquired under a constraint that, for example, the acceleration phase $\varphi_0$ of the high-frequency resonator in the most downstream stage is set to a predetermined reference value (for example, −60° or 60°).

Next, a beam is generated by operating the high-energy multistage linear acceleration unit 14 in accordance with the calculated tentative high-frequency parameters (S42), and the operating parameters of the high-energy multistage linear acceleration unit 14 are adjusted in order to maximize the intensity of the beam current (S43). The intensity of the beam current is adjusted under a condition that the values of the high-frequency parameters of the part of the stages including at least the most downstream stage are fixed to values different from the values of the high-frequency parameters for achieving the maximum acceleration. For example, the high-frequency parameters or the Q lens parameters on the most upstream side functioning as a buncher are adjusted, and the acceleration phase $\varphi_0$ of the high-frequency resonator in the most downstream stage is not changed from the reference value of the acceleration phase $\varphi_0$. Accordingly, the acquired intensity of the beam current is maximized in a state where a margin for finely adjusting the beam energy remains.

Next, the beam energy of the ion beam generated by the high-energy multistage linear acceleration unit 14 is measured (S44). In a case where the difference between the measured value and the target value of the beam energy does not fall within the allowed range and where the energy of the ion beam is required to be adjusted (Y in S46), the high-frequency parameters of the most downstream stage are adjusted to acquire the target beam energy (S48). For example, the acceleration phase $\varphi_0$ is changed close to 0° if the beam energy is insufficient, and the acceleration phase $\varphi_0$ is changed close to −90° or 90° if the beam energy is excessive. In this case, the set values of devices downstream of the high-energy multistage linear acceleration unit 14 are appropriately adjusted in accordance with the amount of adjustment of the beam energy. After completion of adjustment of the energy of the ion beam, the ion beam is generated in accordance with the adjusted high-frequency parameters, and the ion implantation process is executed (S50). In a case where the difference between the measured value and the target value of the beam energy falls within the allowed range and where the energy of the ion beam is not required to be adjusted (N in S46), the process of S48 is not performed, and the ion implantation process is executed with the ion beam generated in accordance with the calculated high-frequency parameters (S50).

According to the present embodiment, tentative high-frequency parameters can be calculated in advance such that the adjustment margin is achieved. Consequently, even if an error greater than the allowed range occurs between the measured value and the target value of the beam energy, the value of the energy of the ion beam can be accurately adjusted by using the prepared adjustment margin. Accordingly, time-taking optimization is not required to be executed multiple times in order to adjust the beam energy, and the amount of time or effort taken for adjustment can be reduced. Accordingly, the value of the beam energy generated by multistage linear accelerators can be accurately and simply adjusted.

The present invention is described heretofore based on the embodiment. The present invention is not limited to the embodiment. Those skilled in the art may understand that various design changes can be made, that various modification examples can be made, and that such modification examples fall within the scope of the present invention.

The above embodiment illustrates the case of determining tentative high-frequency parameters before adjustment of the energy of the beam by performing optimization by the control operation device 54. In a modification example, a predetermined parameter set may be input from outside as the high-frequency parameters before adjustment of the energy of the beam without executing optimization each time required. The parameter set may be calculated in advance outside the ion implantation apparatus 100 or may be acquired by optimization executed in the past by the ion implantation apparatus 100. The energy of the beam can be adjusted in the same manner as the above embodiment by using, as the parameters before adjustment, the parameter set of the part of the stages including at least the most downstream stage that has values different from the maximum acceleration condition.

The above embodiment illustrates a method for adjusting the value of the beam energy used in ion implantation to a constant target value during the implantation process. In a modification example, the high-frequency parameters of the most downstream stage may be adjusted in order to change the value of the beam energy during the implantation process performed for one wafer. For example, the value of the acceleration phase $\varphi_0$ of the high-frequency resonator in the most downstream stage may be changed in accordance with an implantation position on the surface of the wafer, and the wafer may be irradiated with beams having different energy depending on the implantation position.

In this case, the control device may determine a variable parameter that changes the value of the acceleration phase $\varphi_0$ in accordance with the implantation position on the surface of the wafer. A predetermined pattern of the acceleration phase $\varphi_0$ that changes as time elapses may be set in the variable parameter. In the case of changing the value of the beam energy in accordance with different positions in the mechanical scan direction (y direction) on the wafer, the variable parameter may be determined in accordance with the cycle of the mechanical scan of the wafer. In the case of changing the value of the beam energy in accordance with different positions in the beam scan direction (x direction), the variable parameter may be determined in accordance with the cycle of the beam scan. By changing the beam energy in accordance with the determined variable parameter, different energy can be used per implantation region in one ion implantation process.

It should be understood that the invention is not limited to the above-described embodiment, but may be modified into various forms on the basis of the spirit of the invention. Additionally, the modifications are included in the scope of the invention.

What is claimed is:

1. An ion implantation method using an ion implantation apparatus including a high-energy multistage linear acceleration unit, the high-energy multistage linear acceleration unit including a plurality of stages of high-frequency resonators and operating in accordance with a high-frequency parameter determining voltage amplitudes, frequencies, and phases of the high-frequency resonators in each stage, the method comprising:

measuring a beam energy of an ion beam that is generated by the high-energy multistage linear acceleration unit operating in accordance with a tentative high-frequency parameter;

adjusting a value of the high-frequency parameter based on the measured beam energy in order to acquire a target beam energy; and performing ion implantation by using the ion beam generated by the high-energy multistage linear acceleration unit operating in accordance with the adjusted high-frequency parameter, wherein the tentative high-frequency parameter is determined in such a manner that a value different from the value of the high-frequency parameter for achieving a maximum acceleration in design is provided to the high-frequency resonator in a part of the plurality of stages of the high-frequency resonators including at least a most downstream stage, and the adjusting includes changing at least one of the voltage amplitude and the phase set for the high-frequency resonator in the part including the at least most downstream stage.

2. The ion implantation method according to claim 1, further comprising:

calculating the tentative high-frequency parameter by using a predetermined algorithm with the target beam energy as an input, wherein the calculating is executed under a constraint that at least one of the voltage amplitude and the phase set for the high-frequency resonator in the part including at least the most downstream stage is set to a predetermined reference value that is different from the value of the high-frequency parameter for achieving the maximum acceleration in design.

3. The ion implantation method according to claim 1, further comprising:

calculating the high-frequency parameter in a first mode or a second mode with the target beam energy as an input, wherein in a case that the first mode is specified, the tentative high-frequency parameter is calculated under a constraint that at least one of the voltage amplitude and the phase set for the high-frequency resonator in the part including at least the most downstream stage is set to a predetermined reference value that is different from the value of the high-frequency parameter for achieving the maximum acceleration in design, the value of the high-frequency parameter is adjusted based on the calculated tentative high-frequency parameter, and ion implantation is performed by using the ion beam generated by the high-energy multistage linear acceleration unit operating in accordance with the adjusted high-frequency parameter, and in a case that the second mode is specified, the high-frequency parameter is calculated under a constraint that the voltage amplitude and the phase set for the high-frequency resonator in the part including at least the most downstream stage are set to the high-frequency parameter for achieving the maximum acceleration in design, and ion implantation is performed by using the ion beam generated by the high-energy multistage linear acceleration unit operating in accordance with the calculated high-frequency parameter.

4. The ion implantation method according to claim 2, wherein the adjusting includes calculating, based on the measured beam energy, a plurality of values of beam energies respectively corresponding to a plurality of values which are different from the reference value and to which the high-frequency parameter of the high-frequency resonator in the part including at least the most downstream stage is changed, and selecting any of the plurality of values of beam energies by comparison with a value of the target beam energy and determining a value of a parameter corresponding to the selected value of the beam energy as the adjusted high-frequency parameter.

5. The ion implantation method according to claim 4, wherein the adjusting further includes presenting the calculated plurality of values of beam energies to a user as choices and receiving an input of any of the plurality of beam energies selected by the user, and a value of a parameter corresponding to the value of the beam energy selected by the user is determined as the adjusted high-frequency parameter.

6. The ion implantation method according to claim 1, wherein the tentative high-frequency parameter is provided, to the high-frequency resonator in the part including at least the most downstream stage, as a reference phase that is a value different from a phase for achieving the maximum acceleration in design.

7. The ion implantation method according to claim 6, wherein the reference phase is a value that is shifted by greater than or equal to 30 degrees and less than or equal to 90 degrees from the phase for achieving the maximum acceleration in design.

8. The ion implantation method according to claim 7, wherein the reference phase is a value that is shifted by 60 degrees from the phase for achieving the maximum acceleration in design.

9. The ion implantation method according to claim 1, wherein the tentative high-frequency parameter is provided as a lower value of the voltage amplitude than a maximum value of the voltage amplitude in design to the high-frequency resonator in the part including at least the most downstream stage.

10. The ion implantation method according to claim 1, wherein the ion implantation apparatus further includes a beam deflecting unit that includes an energy analysis electromagnet disposed downstream of the high-energy multistage linear acceleration unit, and the adjusting further includes adjusting a magnetic field parameter of the energy analysis electromagnet in accordance with an amount of adjustment of the high-frequency parameter for the high-frequency resonator in the part including at least the most downstream stage.

11. The ion implantation method according to claim 10, wherein the beam deflecting unit further includes an energy analysis slit that is disposed downstream of the energy analysis electromagnet, and a deflecting electromagnet that is disposed downstream of the energy analysis slit and has an implantation angle correcting function, and the adjusting further includes adjusting a magnetic field parameter of the deflecting electromagnet in accordance with an amount of adjustment of the magnetic field parameter of the energy analysis electromagnet.

12. The ion implantation method according to claim 1, wherein the ion implantation apparatus further includes a beam scanner that is disposed downstream of the high-energy multistage linear acceleration unit, and a beam parallelizer that is disposed downstream of the beam scanner, the beam scanner has a scan origin on a beam reference trajectory in design and is configured to scan an ion beam in a reciprocating manner in a direction perpendicular to the beam reference trajectory in a plane including the beam reference trajectory, the beam parallelizer has a focal point matching the scan origin and is configured to deflect, in order for a plurality of beam trajectories directed at different angles of incidence from the focal point to the beam parallelizer in the plane to be parallel with the beam reference trajectory at the target beam energy, such that the plurality of beam trajectories at different angles are deflected in accordance with each of the angles of incidence, and the measuring includes measuring a degree of beam collimation representing an error in a beam angle in the direction perpendicular to the beam reference trajectory in the plane and calculating the beam energy based on the measured degree of beam collimation.

13. The ion implantation method according to claim 1, wherein the measuring includes measuring a time of flight of the ion beam generated by the high-energy multistage linear acceleration unit and calculating the beam energy based on the measured time of flight.

14. The ion implantation method according to claim 1, wherein the measuring includes measuring a secondary ion mass spectrometry (SIMS) profile of a target irradiated with the ion beam generated by the high-energy multistage linear acceleration unit and calculating the beam energy based on the measured SIMS profile.

15. The ion implantation method according to claim 1, wherein the adjusting includes determining as a variable parameter that changes, in accordance with a position of implantation on the wafer, at least one of the voltage amplitude and the phase set for the high-frequency resonator in the part including at least the most downstream stage, and ion implantation is performed by using the ion beam generated by the high-energy multistage linear acceleration unit operating in accordance with the determined variable parameter, in such a manner that the beam energy differs depending on the position of implantation on the wafer.

16. The ion implantation method according to claim 1, further comprising:

before the measuring of the beam energy, adjusting an operating parameter of the high-energy multistage linear acceleration unit in order to maximize an intensity of a beam current acquired, under a condition that at least one of the voltage amplitude and the phase set for the high-frequency resonator in the part including at least the most downstream stage is fixed to a value different from the value of the high-frequency parameter for achieving the maximum acceleration in design, wherein at least one of the voltage amplitude and the phase set for the high-frequency resonator in the part including at least the most downstream stage is changed in order to acquire the target beam energy, based on the beam energy measured for the ion beam adjusted to maximize the intensity of the beam current.

17. An ion implantation apparatus using the method according to claim 1, comprising:

a control device that controls a high-frequency parameter determining voltage amplitudes, frequencies, and phases of the high-frequency resonators in each stage of the high-energy multistage linear acceleration unit, wherein the control device is configured to measure a beam energy of an ion beam that is generated by the high-energy multistage linear acceleration unit operating in accordance with a tentative high-frequency parameter, and to adjust, based on the measured beam energy, a value of the high-frequency parameter in order to acquire a target beam energy, the tentative high-frequency parameter is determined in such a manner that a value different from the value of the high-frequency parameter for achieving a maximum acceleration in design is provided to the high-frequency resonator in a part of the plurality of stages of the high-frequency resonators including at least a most downstream stage, and the control device adjusts the value of the high-frequency parameter in order to acquire the target beam energy, by changing at least one of the voltage amplitude and the phase set for the high-frequency resonator in the part including at least the most downstream stage.

18. An ion implantation apparatus comprising:

a high-energy multistage linear acceleration unit that includes a plurality of stages of high-frequency resonators; and a control device that controls a high-frequency parameter determining voltage amplitudes, frequencies, and phases of the high-frequency resonators in each stage of the high-energy multistage linear acceleration unit, wherein the control device is configured to measure a beam energy of an ion beam that is generated by the high-energy multistage linear acceleration unit operating in accordance with a tentative high-frequency parameter, and to adjust, based on the measured beam energy, a value of the high-frequency parameter in order to acquire a target beam energy, the tentative high-frequency parameter is determined in such a manner that a value different from the value of the high-frequency parameter for achieving a maximum acceleration in design is provided to the high-frequency resonator in a part of the plurality of stages of the high-frequency resonators including at least a most downstream stage, and the control device adjusts the value of the high-frequency parameter in order to acquire the target beam energy, by changing at least one of the voltage amplitude and the phase set for the high-frequency resonator in the part including at least the most downstream stage.

* * * * *